United States Patent
Kim et al.

(10) Patent No.: US 9,748,317 B2
(45) Date of Patent: Aug. 29, 2017

(54) ORGANIC LIGHT EMITTING DISPLAY DEVICE, ORGANIC LIGHT EMITTING DISPLAY PANEL AND METHOD OF MANUFACTURING THE SAME

(71) Applicant: LG DISPLAY CO., LTD., Seoul (KR)

(72) Inventors: Hanhee Kim, Anseong-si (KR); JaeKi Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/579,548

(22) Filed: Dec. 22, 2014

(65) Prior Publication Data

US 2016/0079322 A1  Mar. 17, 2016

(30) Foreign Application Priority Data

Sep. 16, 2014  (KR) .......................... 10-2014-0122613

(51) Int. Cl.
*H01L 27/32* (2006.01)
*H01L 51/00* (2006.01)
*H01L 51/50* (2006.01)

(52) U.S. Cl.
CPC ...... *H01L 27/3246* (2013.01); *H01L 51/0005* (2013.01); *H01L 51/5012* (2013.01); *H01L 2227/323* (2013.01)

(58) Field of Classification Search
CPC .......................... H01L 27/3246; H01L 27/3295
See application file for complete search history.

(56) References Cited

U.S. PATENT DOCUMENTS

| | | | |
|---|---|---|---|
| 2004/0217695 A1* | 11/2004 | Yoneda | H01L 51/0011 313/504 |
| 2007/0052119 A1* | 3/2007 | Sakai | G02F 1/133516 264/1.7 |
| 2007/0108889 A1* | 5/2007 | Kim | H01L 51/5206 313/503 |
| 2007/0236141 A1 | 10/2007 | Lee et al. | |
| 2009/0072724 A1* | 3/2009 | Seki | H01L 27/3246 313/504 |
| 2009/0121983 A1* | 5/2009 | Sung | H01L 27/3218 345/76 |
| 2009/0184323 A1 | 7/2009 | Yang et al. | |
| 2009/0243482 A1 | 10/2009 | Tohyama et al. | |

(Continued)

FOREIGN PATENT DOCUMENTS

JP  2009-238456 A  10/2009
TW  I224480 B  11/2001

(Continued)

*Primary Examiner* — Michele Fan
(74) *Attorney, Agent, or Firm* — Dentons US LLP

(57) ABSTRACT

An organic light emitting display panel and an organic light emitting display device according to the present invention may include a substrate, a pixel electrode positioned in each of a plurality of pixel areas on the substrate, a bank positioned in a non-emission area on the substrate, having a portion overlapping an edge of each pixel electrode and exposing a portion of each pixel electrode, and an organic layer positioned on each exposed pixel electrode. A plurality of grooves or holes may be positioned in the bank, and a material the same as that of the organic layer may be positioned in the groove or hole.

10 Claims, 25 Drawing Sheets

(56) References Cited

U.S. PATENT DOCUMENTS

| | | | |
|---|---|---|---|
| 2010/0259165 A1* | 10/2010 | Miura | G09G 3/20 313/505 |
| 2012/0001186 A1* | 1/2012 | Kondoh | H01L 27/3246 257/59 |
| 2012/0032207 A1* | 2/2012 | Nishiyama | H01L 27/3248 257/89 |
| 2012/0091439 A1* | 4/2012 | Nishiyama | H01L 27/3216 257/40 |
| 2012/0135556 A1* | 5/2012 | Takeuchi | H01L 27/3246 438/34 |
| 2013/0099218 A1 | 4/2013 | Lee et al. | |
| 2013/0099221 A1* | 4/2013 | Kawamura | H01L 27/3246 257/40 |
| 2013/0147851 A1 | 6/2013 | Yim et al. | |
| 2014/0361260 A1 | 12/2014 | Kim et al. | |
| 2015/0090993 A1* | 4/2015 | Tokuda | H01L 51/50 257/40 |

FOREIGN PATENT DOCUMENTS

| | | |
|---|---|---|
| TW | I313145 B | 8/2009 |
| TW | 201415619 A | 4/2014 |

\* cited by examiner

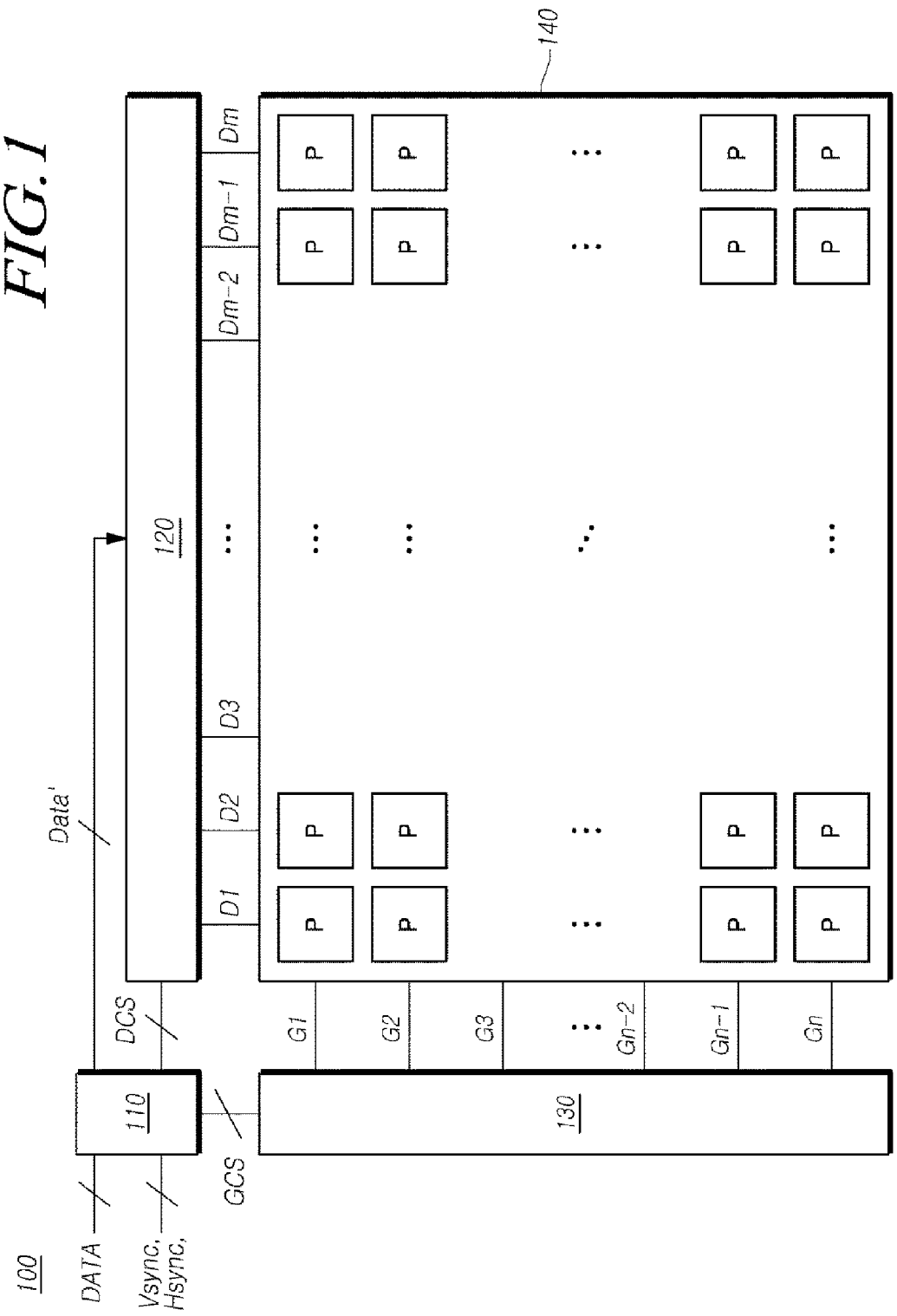

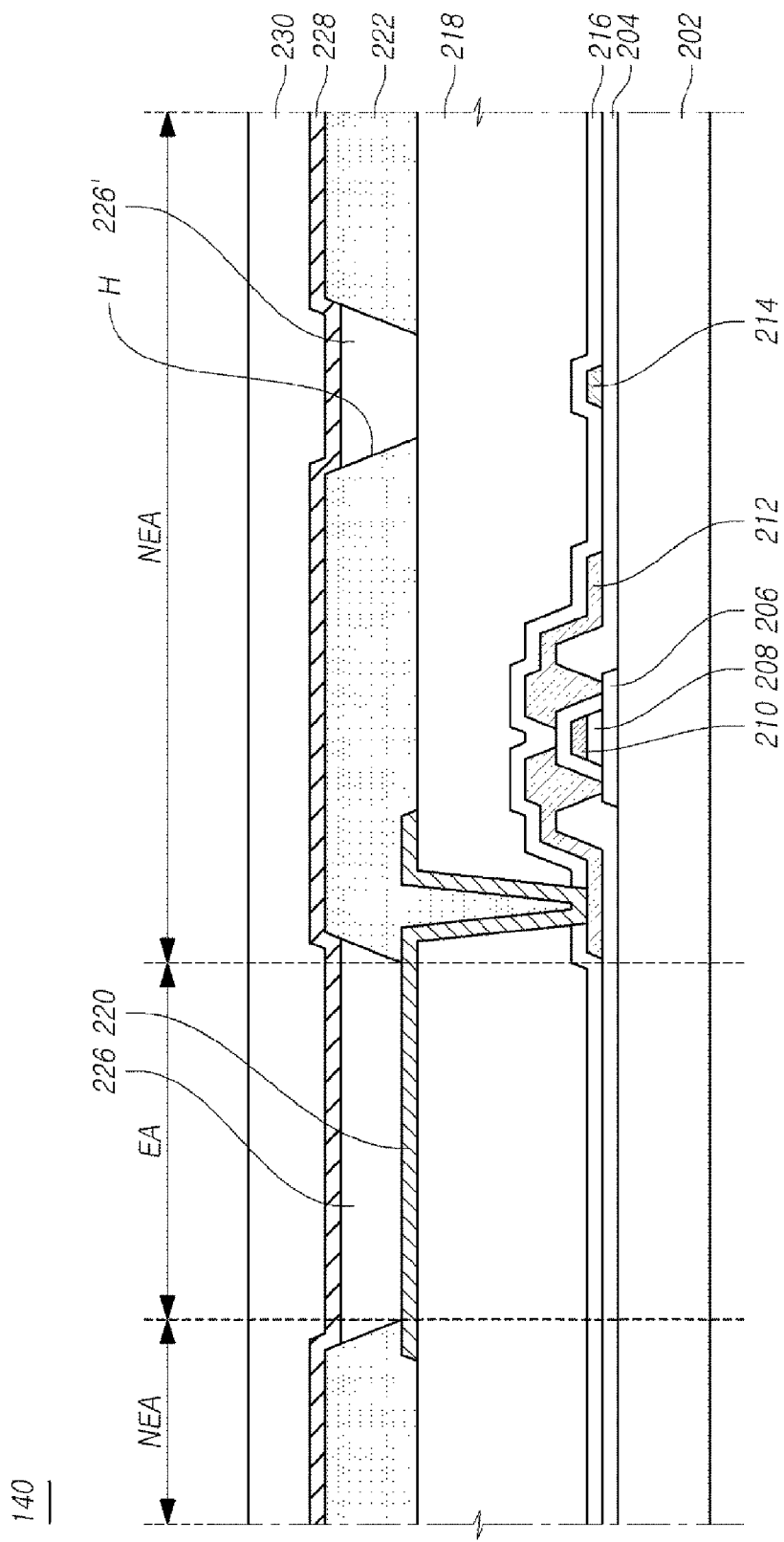

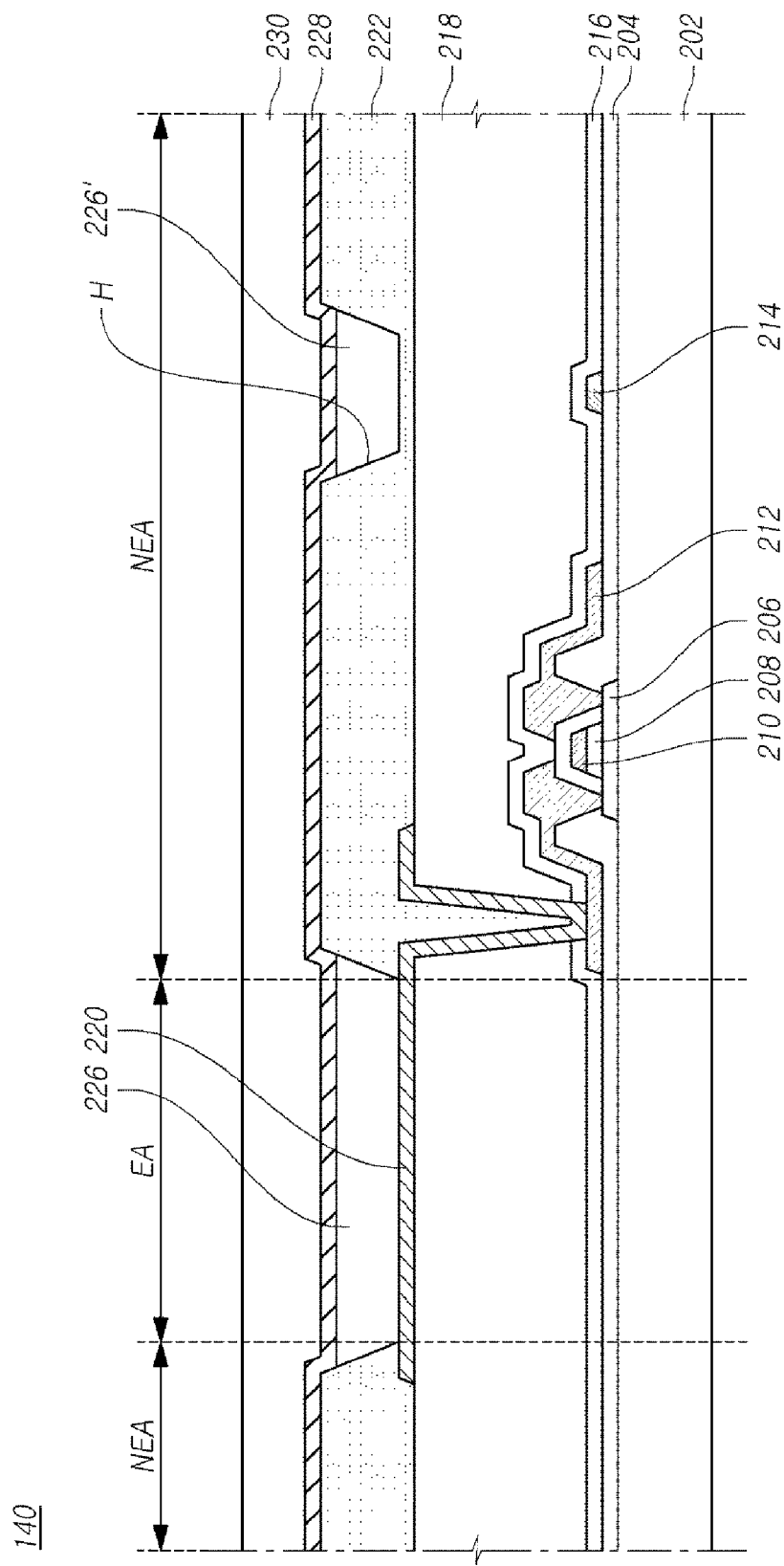

ORGANIC LIGHT EMITTING DISPLAY DEVICE, ORGANIC LIGHT EMITTING DISPLAY PANEL AND METHOD OF MANUFACTURING THE SAME

CROSS-REFERENCE TO RELATED APPLICATION

This application claims priority from and the benefit under 35 U.S.C. §119(a) of Korean Patent Application No. 10-2014-0122613, filed on Sep. 16, 2014, which is hereby incorporated by reference for all purposes as if fully set forth herein.

BACKGROUND OF THE INVENTION

Field of the Invention

The present invention relates to an organic light emitting display device, an organic light emitting display panel and a method of manufacturing the same.

Description of the Prior Art

Liquid Crystal Display (LCD) devices, which are lightweight and consume a small amount of power, have been commonly utilized in the fields of flat panel display devices. However, the LCD device is a non-emissive device which does not generate light by itself, and has drawbacks with reference to brightness, contrast ratio, viewing angle, enlargement, and the like.

Accordingly, a new flat display device that may overcome the drawbacks of the LCD device has been actively researched. An organic light emitting display device, as one of the new flat display devices, is a light emitting device that self emits light and thus, has excellent brightness, viewing angle, and contrast ratio properties, in comparison with the existing LCD device. Also, the organic light emitting display device does not need a backlight. As such, the device may be designed to be lightweight and thin and is advantageous from the perspective of power consumption.

An organic light emitting display panel of the organic light emitting display device displays an image using light emitted from an organic light emitting device connected to a thin film transistor of each pixel area. The light emitting device forms an organic light emitting layer that is formed of organic matter, between an anode and a cathode, and corresponds to a device that generates light by applying an electric field, is driven with a low voltage, consumes a relatively small amount of power, is lightweight, and is manufactured on the top of a flexible substrate.

According to a necessity of an enlargement of the organic light emitting display device, a solution process is being actively developed. However, in the solution process, a luminance is degraded, and a stain is occurred.

In a drying process in the solution process, a vapor amount of a solvent which is generated in a center area of an organic light emitting display panel in an organic light emitting display device and a vapor amount of a solvent which is generated in an edge area of the organic light emitting display panel in the organic light emitting display device are different. Thus, a stain may be generated in an image and a visibility characteristic may be degraded.

SUMMARY OF THE INVENTION

An aspect of the present invention is to provide an organic light emitting display device, an organic light emitting display panel and a method of manufacturing the same capable of preventing luminance degradation in each area and an occurrence of a stain due to a difference of a drying condition in a drying process of a solution process for an organic light emitting display panel.

In accordance with an aspect of the present invention, an organic light emitting display panel may include a substrate, a pixel electrode positioned in each of a plurality of pixel areas on the substrate, a bank positioned in a non-emission area on the substrate, having a portion overlapping an edge of each pixel electrode, and exposing a portion of each pixel electrode, and an organic layer positioned on each exposed pixel electrode. Here, a plurality of grooves or holes may be positioned in the bank, and a material the same as that of the organic layer may be positioned in the groove or hole.

In accordance with another aspect of the present invention, a method of manufacturing an organic light emitting display panel may include forming a pixel electrode in each pixel area on a substrate, forming a bank positioned in a non-emission area on the substrate, having a portion overlapping an edge of each pixel electrode, exposing a portion of each pixel electrode, and including a plurality of grooves or holes, printing an organic solution on the exposed portion in the pixel electrode and in the groove or hole, and drying the organic solution to form an organic layer.

In accordance with another aspect of the present invention, an organic light emitting display device may include a pixel electrode positioned in an emission area on a substrate, and a bank positioned in a non-emission area on the substrate, having an edge overlapping the pixel electrode, and including a plurality of grooves or holes therein.

The present invention can prevent a luminance degradation and an occurrence of a stain of an organic light emitting display panel and an organic light emitting display device.

BRIEF DESCRIPTION OF THE DRAWINGS

The above and other objects, features and advantages of the present invention will be more apparent from the following detailed description taken in conjunction with the accompanying drawings, in which:

FIG. 1 is a system construction diagram related to an organic light emitting display device to which embodiments are applied;

FIG. 2A is a schematic cross-sectional view of one pixel area of an organic light emitting display panel according to a first embodiment;

FIG. 2B is a schematic cross-sectional view of one pixel area of an organic light emitting display panel according to a second embodiment;

DETAILED DESCRIPTION OF THE EXEMPLARY EMBODIMENTS

Figure 3:
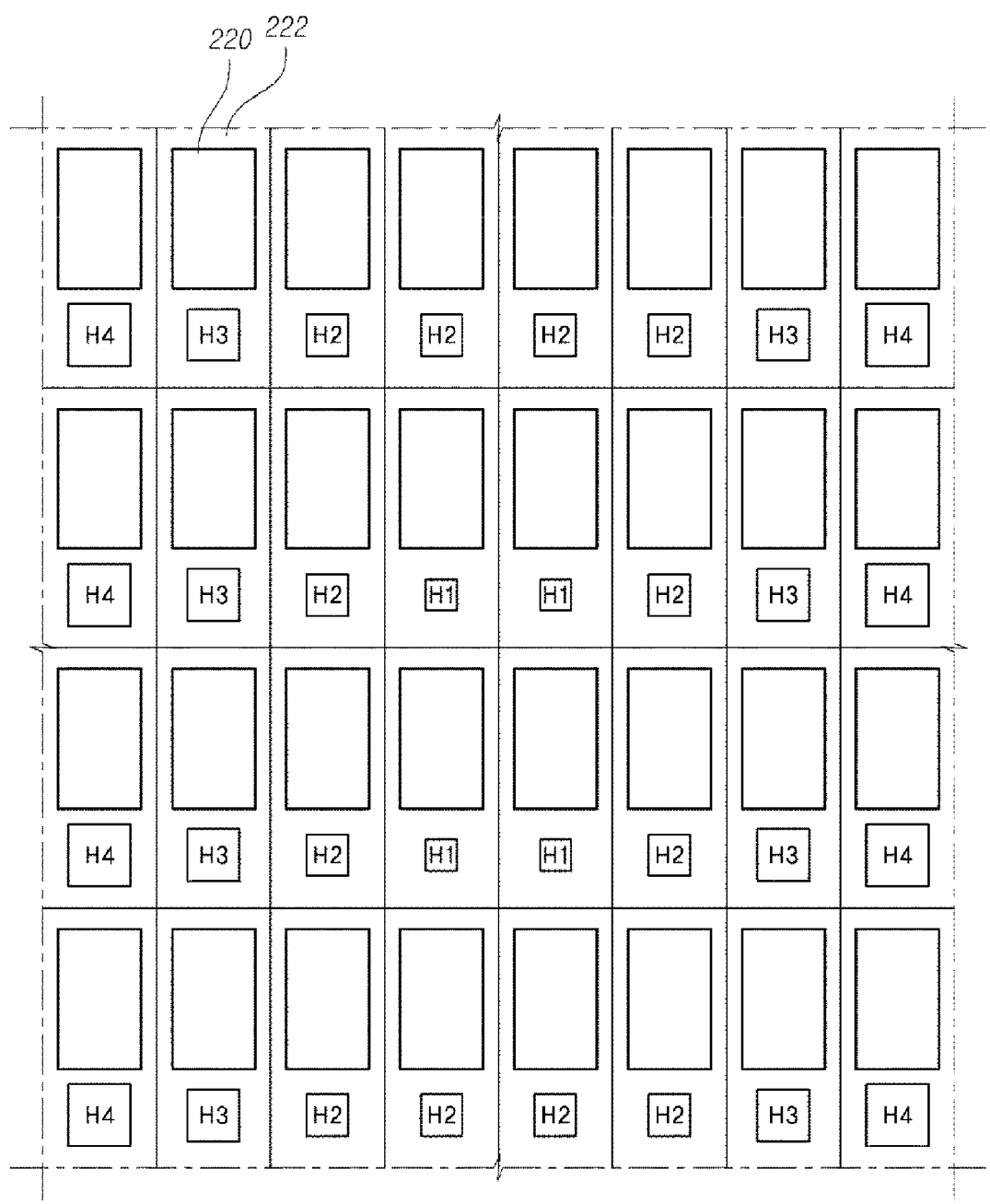
FIG. 3 is a schematic plan view illustrating an organic light emitting display panel according to a third embodiment.

Hereinafter, exemplary embodiments of the present invention will be described with reference to the accompanying drawings. In the following description, the same elements will be designated by the same reference numerals although they are shown in different drawings. Further, in the following description of embodiments of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. These terms are merely used to distinguish one structural element from other structural elements, and a property, an order, a sequence and the like of a corresponding structural element are not limited by the term. It should be noted that if it is described in the specification that one component is "connected," "coupled" or "joined" to another component, a third component may be "connected," "coupled," and "joined" between the first and second components, although the first component may be directly connected, coupled or joined to the second component. Likewise, when it is described that a certain element is formed "on" or "under" another element, it should be understood that the certain element may be formed either directly or indirectly via a still another element on or under another element.

FIG. 1 is a system construction diagram related to an organic light emitting display device to which embodiments are applied.

Referring to FIG. 1, an organic light emitting display device 100 includes an organic light emitting display panel 140, a data driving unit 120, a gate driving unit 130, a timing controller 110, and the like.

The timing controller 110 outputs a data control signal DCS for controlling the data driving unit 120 and a gate control signal GCS for controlling the gate driving unit 130, based on an external timing signal such as horizontal and vertical synchronous signals Vsync and Hsync, image data Data and clock signal CLK input from a host system. Also, the timing controller 110 may convert the image data Data input from the host system into a data signal format that is used in the data driving unit 120 and provide the converted image data Data' to the data driving unit 120.

The data driving unit 120 converts the image data Data' into a data signal (e.g., analog pixel signal or data voltage), which is a voltage value corresponding to a gray scale value to output the converted data signal to data lines D1, D2, . . . , and Dm, in response to the data control signal DCS and the converted image data Data' input from the timing controller 110.

The gate driving unit 130 sequentially supplies a scan signal (i.e., gate pulse, scan pulse, or gate on signal) to gate lines G1, G2, . . . , and GLn in response to the gate control signal GCS input from the timing controller 110.

Meanwhile, each pixel area P on the organic light emitting display panel 140 may be formed in an area defined by the data lines D1, D2, . . . , and Dm and the gate lines G1, G2, . . . , and Gn and may be disposed in a matrix form. Each pixel area P may correspond to at least one organic light emitting device including an anode which is a first electrode, a cathode which is a second electrode and an organic layer.

In each pixel area P, the gate lines G1, G2, . . . , and Gn the data lines D1, D2, . . . , and Dm and a high electric potential voltage line for providing a high electronic potential voltage are formed. In addition, in each pixel area P, a switching transistor is formed between the gate lines G1, G2, . . . , and Gn the data lines D1, D2, . . . , and Dm, and a driving transistor is formed between an organic light emitting diode which includes an anode, a cathode and an organic light emitting layer, a source electrode (or a drain electrode) of the switching transistor and the high electric potential voltage line.

Meanwhile, a bank (not shown) positioned in a non emissive area of each pixel area P includes a groove or hole. A material the same as that of an organic layer (not shown) may be laminated on the groove or hole. The grooves or holes (not shown) in each pixel area P may have the size equal to or different from that of a groove or hole (not shown) in an adjacent pixel area P. In addition, an amount of the material the same as that of the organic layer (not shown) positioned on the groove or hole (not shown) in each pixel area P may be different from an amount of the material the same as that of the organic layer (not shown) positioned on the groove or hole (not shown) in the adjacent pixel area P.

In the specification, the size of the groove or hole (not shown) may be a diameter of the groove or hole (not shown), a cross-section area of the groove or hole (not shown), or a value obtained by a product of multiplication between the cross-section area and the thickness (i.e., depth) of the groove or hole (not shown), that is an internal volume of the groove or hole (not shown).

The organic layer (not shown) of the organic light emitting display panel 140 according to embodiments may be formed by a solution process, for example an inkjet printing, but is not limited thereto.

The groove or hole (not shown) included in the bank (not shown) prevents a visibility characteristic degradation such as a stain occurring in a manufacturing process of the organic light emitting display panel 140.

Specifically, when the solution process is performed, a stain may occur on an image of the organic light emitting display panel 140 according to a drying condition of a solution. That is, since a vapor pressure (i.e., vapor amount)

of a solvent in a center area of the organic light emitting display panel 140 becomes a saturation state and a vapor pressure (i.e., vapor amount) of a solvent in an edge area of the organic light emitting display panel 140 becomes a non-saturation state, a visibility characteristic may be degraded. In order to solve such a problem, in the organic light emitting display panel 140 according to the present invention, a material such as the organic layer (not shown) is laminated in the groove or hole included in the bank (not shown), and thus the vapor pressure (i.e., vapor amount) in each area of the organic light emitting display panel 140 can be the same.

Hereinafter, this will be described in more detail with reference to drawings.

FIG. 2A is a schematic cross-sectional view of one pixel area of an organic light emitting display panel according to a first embodiment. FIG. 2B is a schematic cross-sectional view of one pixel area of an organic light emitting display panel according to a second embodiment.

Referring to FIGS. 2A and 2B, the organic light emitting display panel 140 may include a substrate 202, a pixel electrode 220 positioned in each of a plurality of pixel areas P on the substrate 202, a bank 222 positioned in a non-emission area NEA on the substrate 202, having a portion overlapping an edge of each pixel electrode 220 and exposing a portion of each pixel electrode 220, and an organic layer 226 positioned on each exposed pixel electrode 220.

In addition, the organic light emitting display panel 140 may further include a transistor including a semiconductor layer 206, a gate electrode 210 and source/drain electrodes 212 on the substrate 202, various signal lines 214, a first insulating film 204 insulating between the gate electrode 210 and the source/drain electrodes 212, a second insulating film 216 covering the source/drain electrodes 212 and the signal line 214, and a planarization layer 218 covering the second insulating film 216. Furthermore, the organic light emitting display panel 140 may include a common electrode 228 formed on a whole surface so as to cover the organic layer 226 and the bank 222, and a protection layer 230 protecting the organic layer 226 from an external moisture and oxygen.

Here, a plurality of grooves or holes H may be positioned in the bank 222 positioned in the non-emission area NEA of the organic light emitting display panel 140, and a material 226' the same as that of the organic layer 226, which is positioned on the groove or hole H.

The substrate 202 may be a plastic substrate including polyethylene terephthalate (PET), polyethylene naphthalate (PEN), and polyimide, as well as a glass substrate. In addition, a buffer layer for blocking an infiltration of impurities may be further formed on the substrate 202. The buffer layer may be formed as a single layer or multiple layers including, for example, silicon nitride (SiNx) or silicon oxide (SiOx).

The semiconductor layer 206 may include metal oxide, for example, may include any of Indium Galium Zinc Oxide (IGZO), Zinc Tin Oxide (ZTO) and Zinc Indium Oxide (ZIO), but is not limited thereto. The semiconductor layer 206 may be formed of amorphous silicon (a-Si) or polysilicon.

The gate electrode 210 transfers a gate signal to the transistor. The gate electrode 210 may be formed as a single layer or multiple layers including a metal or an alloy having at least one of Al, Pt, Pd, Ag, Mg, Au, Ni, Nd, Ir, Cr, Li, Ca, Mo, Ti, W and Cu. In addition, the source/drain electrodes 212 electrically connected to the semiconductor layer 206 may be formed of a high melting point metal such as chrome (Cr) or tantalum (Ta), but is not limited thereto.

Meanwhile, a gate insulating film, the first gate insulating film 204 and the second insulating film 216 may be formed of inorganic insulation material such as $SiO_x$, $SiN_x$, SiON, $Al_2O_3$, $TiO_2$, $Ta_2O_5$, $HfO_2$, $ZrO_2$, BST and PZT or may be formed of organic insulation material including BenzoCycloButene (BCB) and acryl series resin or a combination thereof.

The planarization layer 218 may be formed of, for example, any of silicon oxynitride (SiON), silicon nitride (SiNx), silicon oxide (SiOx), and aluminum oxide (AlOx) as a hydrogen containing inorganic film with a hydrophobic characteristic, considering a mechanical strength, a water vapor resistance, an ease film formation, productivity and the like.

The pixel electrode 220 is electrically connected to the source/drain electrodes 212 through a contact hole formed in the planarization layer 218. The pixel electrode 220 has a relatively high work function value so as to play a role of an anode (i.e., positive electrode). The pixel electrode 220 may be formed of a transparent conductive material, and for example, may be formed of a metal oxide such as ITO or IZO, an alloy of a metal and an oxide such as ZnO:Al or SnO2:Sb, and a conductive high molecule material such as poly (3-methyl thiophen), poly (3,4-(Ethylene-1,2-Diauxie Thiophen) (PEDT), polypyrrole and polyaniline. In addition, the pixel electrode 220 may be formed of carbon nanotubes, graphene, silver nanowires and the like.

In addition, in a case of a top emission, in order to improve reflection efficiency, a reflection plate including a metal material of which reflection efficiency is superior, such as aluminum (Al) or silver (Ag) may be further formed on upper and lower portions of the pixel electrode 220, as a subsidiary electrode.

As shown in FIG. 2A, an emission area EA of the organic light emitting display panel 140 means an area on the exposed pixel electrode 220, and the area except for the emission area EA is the non-emission area NEA.

Meanwhile, the bank 222 is formed in an edge area of the pixel electrode 220, and an opening portion is included in the bank 222 to expose the pixel electrode 220. The bank 222 may be formed of an inorganic insulation material such as silicon nitride (SiNx) and silicon oxide (SiOx), an organic insulation material such as benzocyclobutene or acrylic resin, or a combination thereof, but is not limited thereto.

The organic layer 226 is formed on the exposed pixel electrode 220. In the organic layer 226, a Hole Injection Layer (HIL), a Hole Transfer Layer (HTL), an Emitting Layer (EL), an Electron Transfer Layer (ETL), an Electron Injection Layer (EIL), and the like may be sequentially laminated so that a hole and an electron are smoothly transferred to form an exciton.

Meanwhile, the plurality of grooves or holes H may be formed in the bank 222 positioned in the non-emission area NEA. FIG. 2A illustrates a case in which the hole is formed in the bank 222, and FIG. 2B illustrates a case in which the groove is formed in the bank 222. However, the shape, the form, the size and the like of the groove or hole are only for convenience of description, and they may be variously designed. In addition, hereinafter, the groove or hole may be written as groove/hole H.

Meanwhile, the material the same as that of the organic layer 226 may be formed on the groove or hole H.

The organic layer 226 and the material the same as that of the organic layer 226, which is positioned on the groove or hole H, may be formed by a solution process, for example, may be formed by an inkjet printing, but is not limited thereto. In a case of the solution process, a printed material may be a high molecular material, but is not limited thereto, and may be a proper low molecular material.

Specifically, in a case of an electronic device such as an organic light emitting display device, when each of the layers is formed, a deposition scheme is mainly used. Since the deposition scheme can prevent a mixing of deposition impurities, the deposition scheme is an effective means. However, loss of material is large in a manufacturing process, a costly vacuum device is necessary, and a large size implementation is difficult. In addition, in a manufacturing of the electronic device, a photolithography process is commonly used. The photolithography process can perform a fine pattern process, and is a technique by which an application field is widely secured until now. However, process cost is relatively high, process steps are complex, the photolithography process is limited according to a transferred surface condition, and there is a limit of a photoresist material used in the photolithography process. A new technique is required in a state in which a current degree of integration becomes higher and a technique related to a next generation display having a low cost and a large size using a flexible organic electronic device is being actively developed.

The solution process of the present specification is less expensive and simple compared to a deposition process such as a sputtering, and may be a core technique in an enlargement of the organic light emitting display panel 140.

For example, an inkjet printing technique is a scheme which injects a solution manufactured in an ink form through a minute nozzle as a bubble of several tens of picoliters.

The above-mentioned groove or hole H positioned in the non-emission area NEA of the pixel area P prevents an image degradation due to a difference of a drying condition in the solution process.

That is, the drying process after the inkjet printing is one of elements which have a large effect on a result. Especially, the drying process is important to improve a printed result, that is to control the form of the thickness and uniformity of a surface. In an ink, a solvent and a solid matter are combined. If the ink is printed in a wide area, a difference of a drying speed between a center area of the organic light emitting display panel 140 and an edge area of the organic light emitting display panel 140 may occur.

Specifically, when the material of the organic layer 226 is spread in the inkjet printing scheme, the solvent included in the material is volatilized and dried. The vapor amount (or vapor pressure) of the volatilized solvent is large in the center area where many pixel areas P are positioned adjacent to the vapor amount of the volatilized solvent. In a case of the pixel area P which is positioned in the edge area, since an amount of the spread ink is relatively small, the vapor amount of the volatilized solvent is small. The difference of the vapor amount induces a spread of vapor molecules from the center area having a high concentration to the edge area having a low concentration. Therefore, the organic layer 226 in the pixel area P of the edge area may be dried in a shape in which the organic layer 226 leans to the outside according to a movement of gas.

Thus, uniformly drying the organic layer 226 is hindered due to a difference in a concentration of an evaporated solvent molecule, and thus the organic layer 226 may be dried in a shape in which the thickness of the organic layer 226 is not uniform in the edge area of the organic light emitting display panel 140. The non-uniformity of a film thickness causes a luminance non-uniformity. Thus, a visibility characteristic degradation such as a stain may occur.

The bank 222 of the organic light emitting display panel 140 according to the present invention includes the groove or hole H positioned in the non-emission area NEA. The present invention can obtain uniform image quality through a whole surface of the organic light emitting display panel 140, by controlling the vapor amount through the groove or hole H positioned in the non-emission area NEA. That is, the material 226' the same as that of the organic layer 226 is spread in the groove or hole H to control the vapor amount of the center area and the edge area uniformly, and thus a degradation of the image quality may be prevented.

Meanwhile, the common electrode 228 may be a cathode (i.e., negative electrode), and may be formed of a material of which a work function is relatively low. For example, in a case of a bottom emission scheme, for example, the common electrode 228 may be a metal or a monolayer or multiple layers of an alloy in which a first metal, for example, silver (Ag), and a second metal, for example, magnesium, are mixed in a predetermined proportion.

The protection layer 230 may be formed of a metal thin film, may be a structure using a frit, but is not limited thereto, and may be formed by various schemes.

Hereinafter, an organic light emitting display panel 140 according to various embodiments is specifically described.

Figure 4:
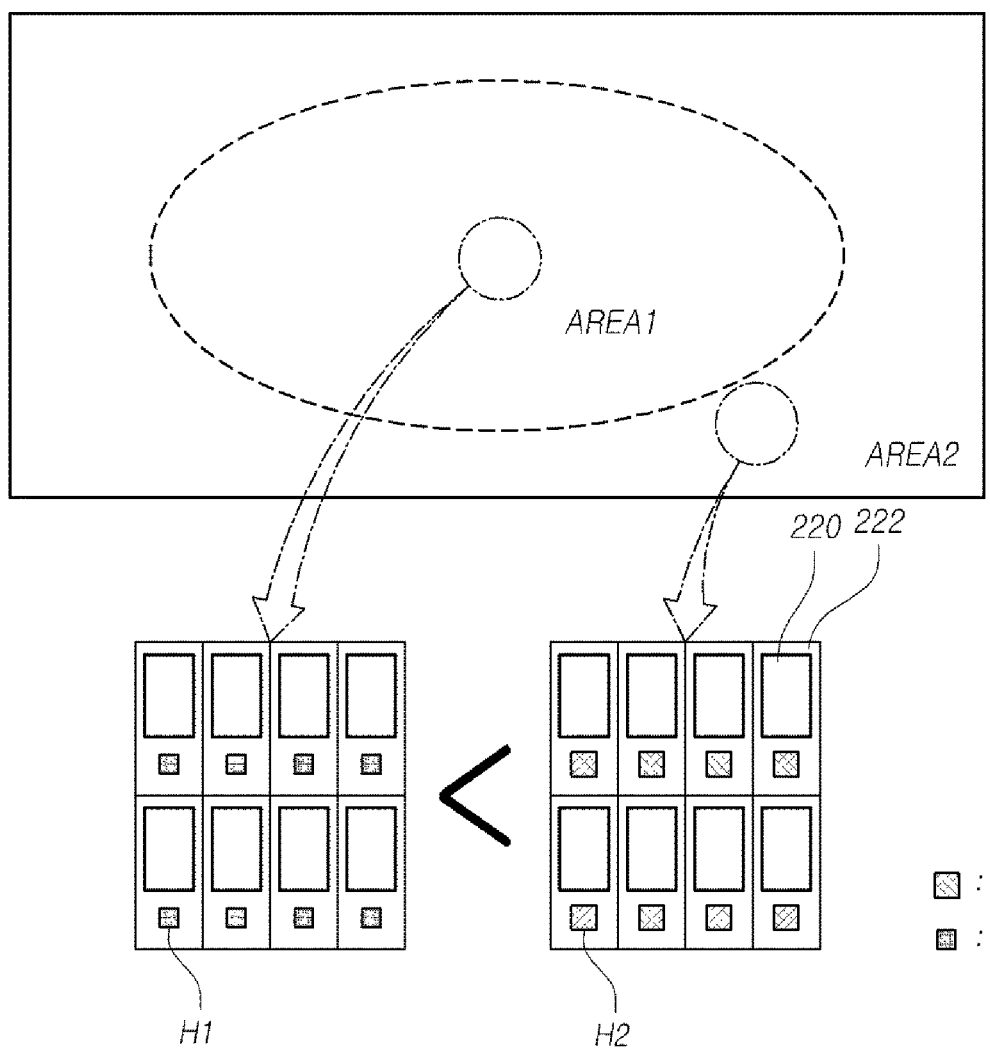
FIG. 4 is a schematic plan view illustrating an organic light emitting display panel according to a fourth embodiment.
Figure 5:
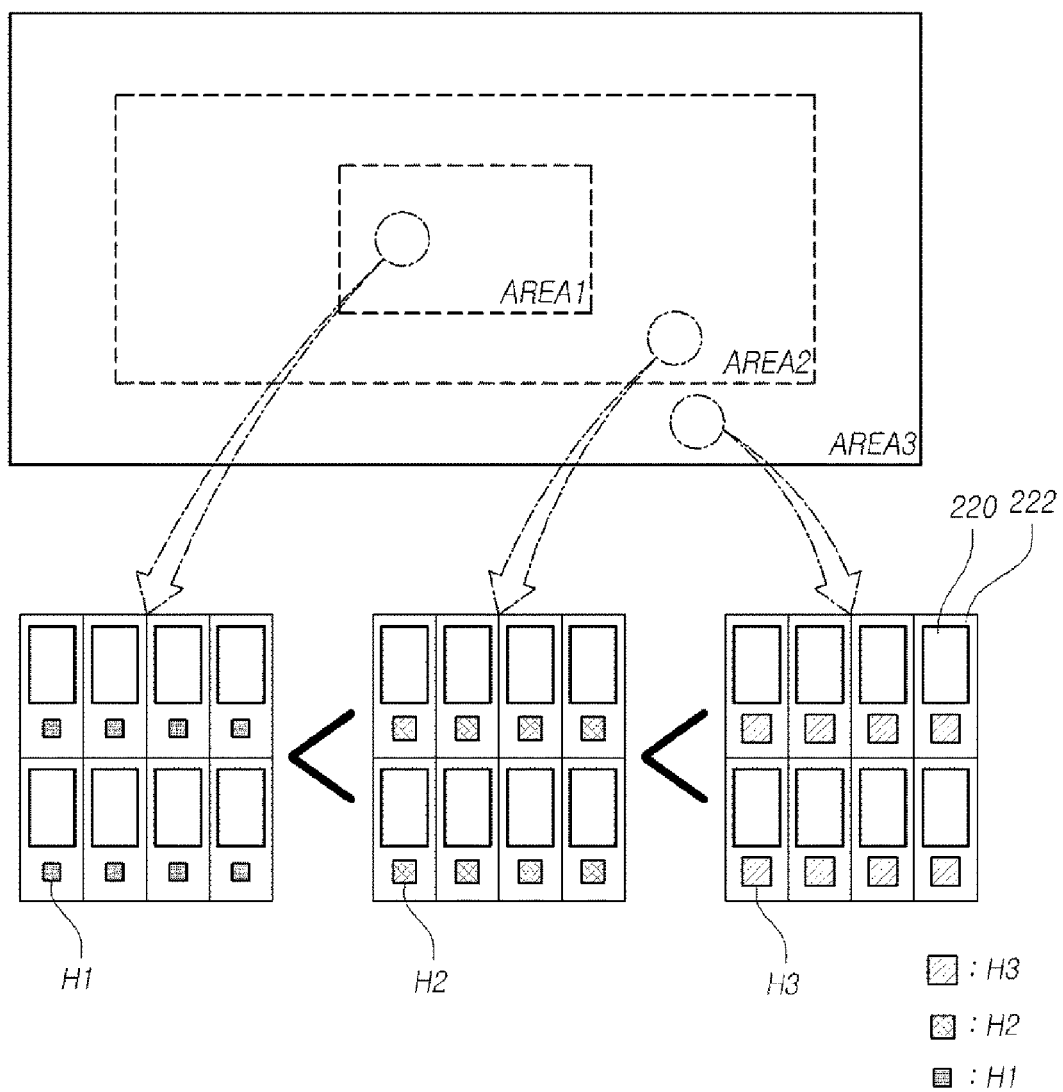
FIG. 5 is a schematic plan view illustrating an organic light emitting display panel according to a fifth embodiment.
Figure 6:
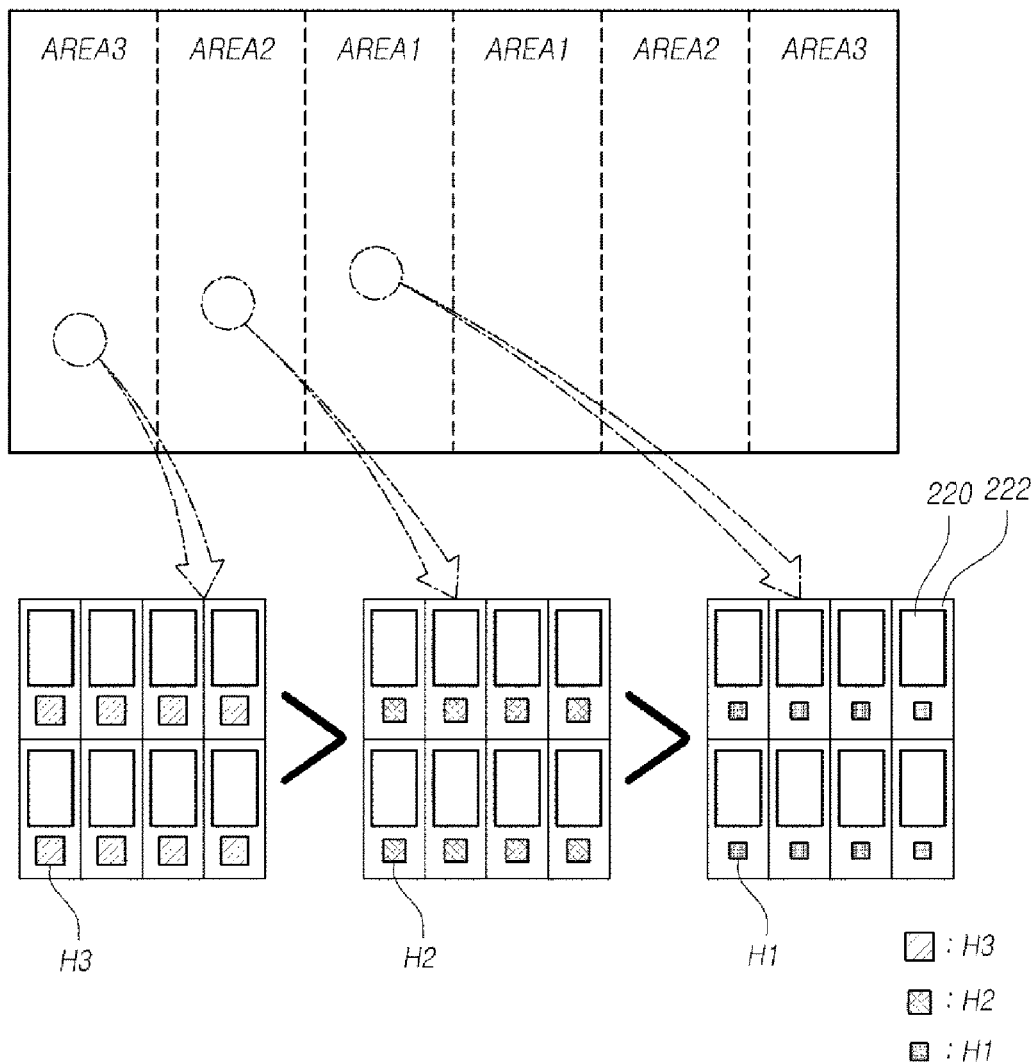
FIG. 6 is a schematic plan view illustrating an organic light emitting display panel according to a sixth embodiment.
Figure 7:
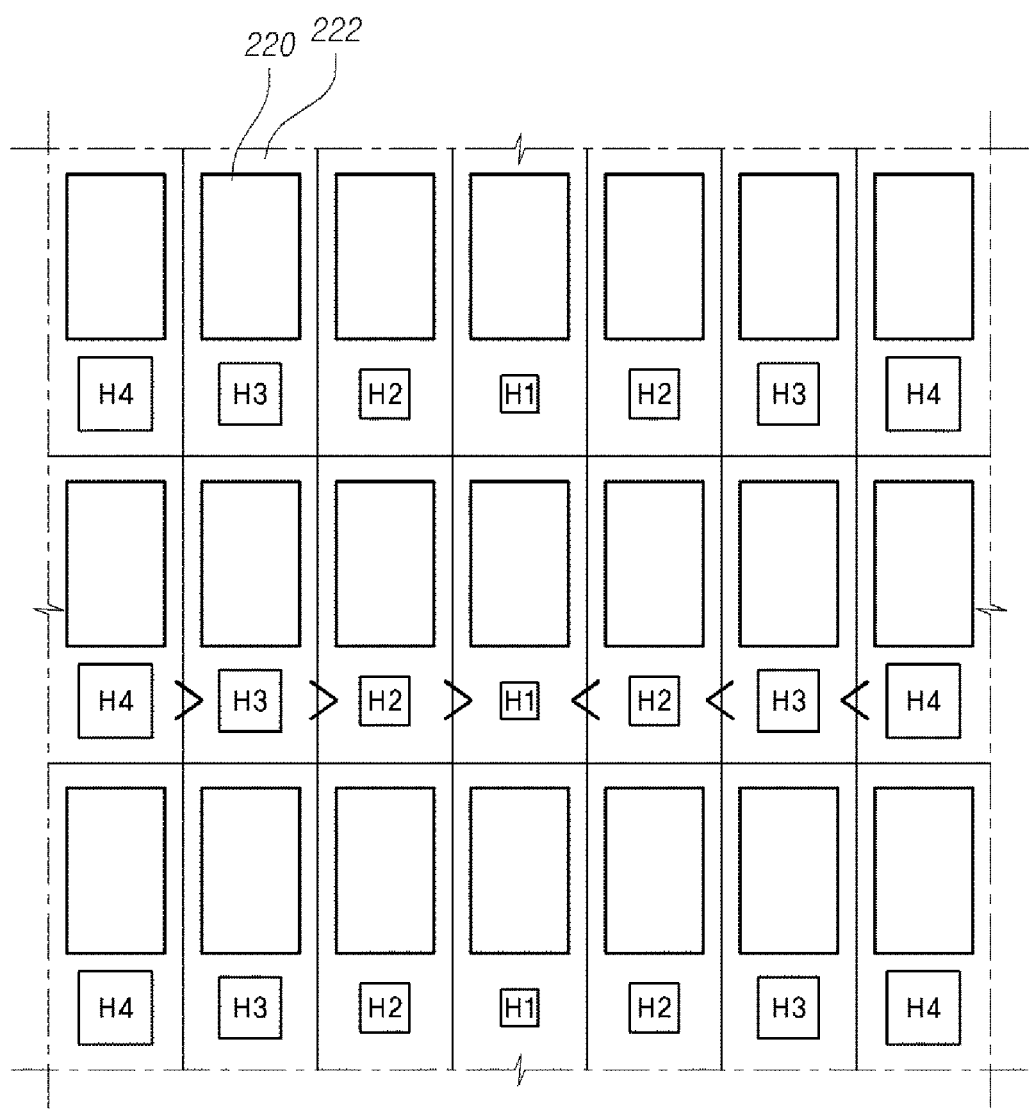
FIG. 7 is a schematic plan view illustrating an organic light emitting display panel according to a seventh embodiment.
Figure 8:
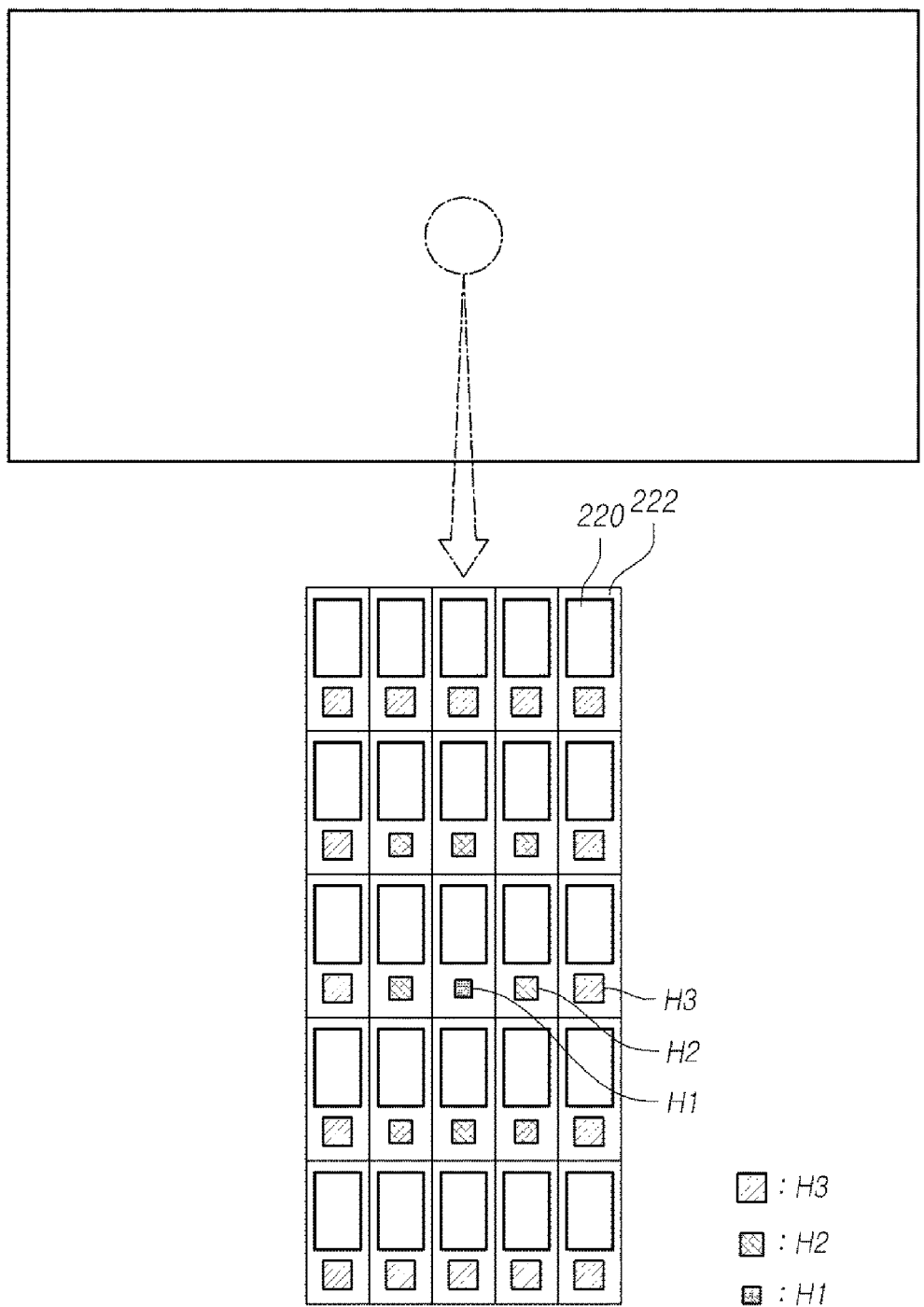
FIG. 8 is a schematic plan view illustrating an organic light emitting display panel according to an eighth embodiment.

FIG. 3 is a schematic plan view illustrating an organic light emitting display panel according to a third embodiment. FIG. 4 is a schematic plan view illustrating an organic light emitting display panel according to a fourth embodiment. FIG. 5 is a schematic plan view illustrating an organic light emitting display panel according to a fifth embodiment. FIG. 6 is a schematic plan view illustrating an organic light emitting display panel according to a sixth embodiment. FIG. 7 is a schematic plan view illustrating an organic light emitting display panel according to a seventh embodiment. FIG. 8 is a schematic plan view illustrating an organic light emitting display panel according to an eighth embodiment.

Referring to FIG. 3, the sizes of the grooves or holes positioned in the non-emission area NEA of the organic light emitting display panel 140 may be the same or different.

That is, the closer the grooves or holes H1, H2, H3 and H4 of the bank 222 positioned in the non-emission area NEA of the pixel area P are to the edge area of the organic light emitting display panel 140, the larger the sizes of the grooves or holes H1, H2, H3 and H4 may be. In addition, the closer the grooves or holes H1, H2, H3 and H4 of the bank 222 positioned in the non-emission area NEA of the pixel area P are to the center area of the organic light emitting display panel 140, the smaller the sizes of the grooves or holes H1, H2, H3 and H4 may be. In other words, the farther the grooves or holes H1, H2, H3 and H4 included in the bank 222 are from the center area and the closer the grooves or holes H1, H2, H3 and H4 included in the bank 222 are to the edge area, the larger the sizes of the grooves or holes H1, H2, H3 and H4 included in the bank 222 may be (H1<H2<H3<H4).

Specifically, the size (i.e, a cross-section area in the FIG. 3) of a first groove/hole H1 positioned in a center area (i.e., a central area in FIG. 3) of the organic light emitting display panel 140 may be smaller than that of a second groove/hole H2 adjacent to the edge area compared to the first groove/hole H1. In addition, the size of the second groove/hole H2 may be smaller than that of a third groove/hole H3 adjacent to the edge area compared to the second groove/hole H2. In addition, the size of the third groove/hole H3 may be smaller than that of a third groove/hole H3 adjacent to the edge area compared to the third groove/hole H3. That is, a relation of the size of the first groove/hole H1<the size of the second groove/hole H2<the size of the third groove/hole H3<the size of the fourth groove/hole H4 may be valid.

The material the same as that of the organic layer 226 is positioned on the grooves or holes H1, H2, H3 and H4. The amount of the vapor generated in the drying process of the solution process can be made uniform by controlling the amount of the material, and thus the drying condition can be the same. Therefore, a uniform image can be implemented on a whole of the organic light emitting display panel 140.

Referring to FIG. 4, the sizes of the grooves or holes H1 and H2 included in the bank 222 of the pixel area P positioned in the edge area of the organic light emitting display panel 140 may be larger than those of the grooves or holes H1 and H2 included in the bank 222 of the pixel area P positioned in the center area of the organic light emitting display panel 140.

Here, the organic light emitting display panel 140 according to the fourth embodiment may include a first area Area1 and a second area Area2. The first area Area1 may be the center area, and the second area Area2 may be the edge area.

Specifically, the size of the first groove/hole H1 formed in the non-emission area NEA in the bank 222 of the pixel area P in the first area Area1 may be smaller than that of the second groove/hole H2 formed in the non-emission area NEA in the bank 222 of the pixel area P in the second area Area2.

When the material 226' the same as that of the organic layer 226 is laminated on the grooves/holes H1 and H2 in the same depth or height, an amount of the material 226' the same as that of the organic layer 226, which is laminated on the second groove/hole H2 is larger than that of the material 226' the same as that of the organic layer 226, which is laminated on the first groove/hole H1. Therefore, in the first area Area1 and the second area Area2, a drying speed and an amount of an evaporated solvent may become uniform.

Referring to FIG. 5, the organic light emitting display panel 140 according to the fifth embodiment may include a first area Area1, a second area Area2 and a third area Area3. The first area Area1 is the center area, and the third area Area3 is the edge area.

The size of the first groove/hole H1 formed in the first area Area1 may be smaller than that of the second groove/hole H2 formed in the second area Area2. In addition, the size of the second groove/hole H2 formed in the second area Area2 may be smaller than that of the third groove/hole H3 formed in the third area Area3.

Here, the sizes of the first grooves/holes H1 in the first area Area1 may be the same. The sizes of the second grooves/holes H2 in the second area Area2 may be the same. The sizes of the third grooves/holes H3 in the third area Area3 may be the same.

Referring to FIG. 6, the organic light emitting display panel 140 according to the sixth embodiment may include a first area Area1, a second area Area2 and a third area Area3. The first area Area1 is the center area, and the third area Area3 is the edge area in a first direction (i.e., horizontal direction in FIG. 6).

The size of the first groove/hole H1 formed in the first area Area1 is smaller than that of the second groove/hole H2 formed in the second area Area2, and the size of the second groove/hole H2 formed in the second area Area2 is smaller than that of the third groove/hole H3 formed in the third area Area3 (H1<H2<H3). Therefore, a drying atmosphere and a drying condition of the organic light emitting display panel 140 can be uniform in the first direction.

Referring to FIG. 7, the organic light emitting display panel 140 according to the seventh embodiment is not divided in predetermined areas shown in FIG. 5 or FIG. 6, and the sizes of the grooves/holes H1, H2, H3 and H4 may be different in each pixel area P.

FIG. 7 illustrates an embodiment of a case in which the farther the plurality of grooves/holes H1, H2, H3 and H4 are from the center area of the organic light emitting display panel 140 and the closer the plurality of grooves/holes H1, H2, H3 and H4 are to the edge area in the first direction (i.e., horizontal direction in the FIG. 7), the larger the sizes of the plurality of grooves/holes H1, H2, H3 and H4 are.

Referring to FIG. 8, in the organic light emitting display panel 140 according to the eighth embodiment, the sizes of the grooves/holes H1, H2 and H3 formed in each pixel area P may be different.

Specifically, the farther the grooves/holes H1, H2 and H3 are from the center area and the closer the grooves/holes H1, H2 and H3 are to the edge area, the larger the sizes of the of grooves/holes H1, H2 and H3 may be. Therefore, the closer the pixel area P is to the edge area, the larger the material 226' the same as that of the organic layer 226 formed on the grooves or holes H1, H2 and H3 may be. Thus, an organic solution is printed and dried, a vapor amount is uniformly maintained on a whole surface of the organic light emitting display panel 140, and therefore visibility characteristic degradation can be prevented.

In the organic light emitting display panel 140 according to the embodiments described above, the sizes of the grooves/holes may be different in each area in each pixel area P. That is, the amount of the material 226' the same as that of the organic layer 226, which is positioned on the grooves or holes, may be different.

Specifically, the farther the groove or hole H is from the center of the organic light emitting display panel 140 and the closer the groove or hole H is to the edge area of the organic light emitting display panel 140, the larger the amount of the material 226' the same as that of the organic layer 226, which is positioned on the groove or hole H, may be. In addition, the amount of the material 226' the same as that of the organic layer 226, which is positioned on the groove or hole H in the edge area (e.g., the second area Area2 or the third area Area3) of the organic light emitting display panel 140, may be larger than that of the material 226' the same as that of the organic layer 226, which is positioned on the groove or hole H in the center area (e.g., the first area Area1).

As described in the third to eighth embodiments above, in the organic light emitting display panel 140 according to the present invention, the grooves/holes may be various sizes through a whole surface of the organic light emitting display panel 140, and thus the amount of the material 226' the same as that of the organic layer 226 may vary. In addition, the organic light emitting display panel 140 according to the present invention may be variously designed without being limited to the third to eighth embodiments described above.

That is, the plurality of grooves/holes H positioned in the non-emission area NEA may be formed in various sizes, shapes and forms, and the sizes may become different in various directions. For example, the shape of the groove/hole H in a plan view may have various shapes such as a circle, an ellipse, a rectangle, a square and a polygon, and the sizes may become larger in a first direction (i.e., a horizontal direction in a figure), a second direction (i.e, a vertical direction in a figure) and a diagonal direction. In addition, the shape and the size of the emission area EA in a plan view may also be variously designed.

Thus, the drying condition can be uniformly maintained through the whole surface of the organic light emitting display panel, by controlling the amount of the material 226' the same as the organic layer 226. Therefore, in the organic light emitting display panel 140 and the organic light emitting display device 100 including the same, visibility characteristic degradation such as luminance degradation and a stain occurrence can be prevented, and a lifetime of a product can be increased.

Figure 9:
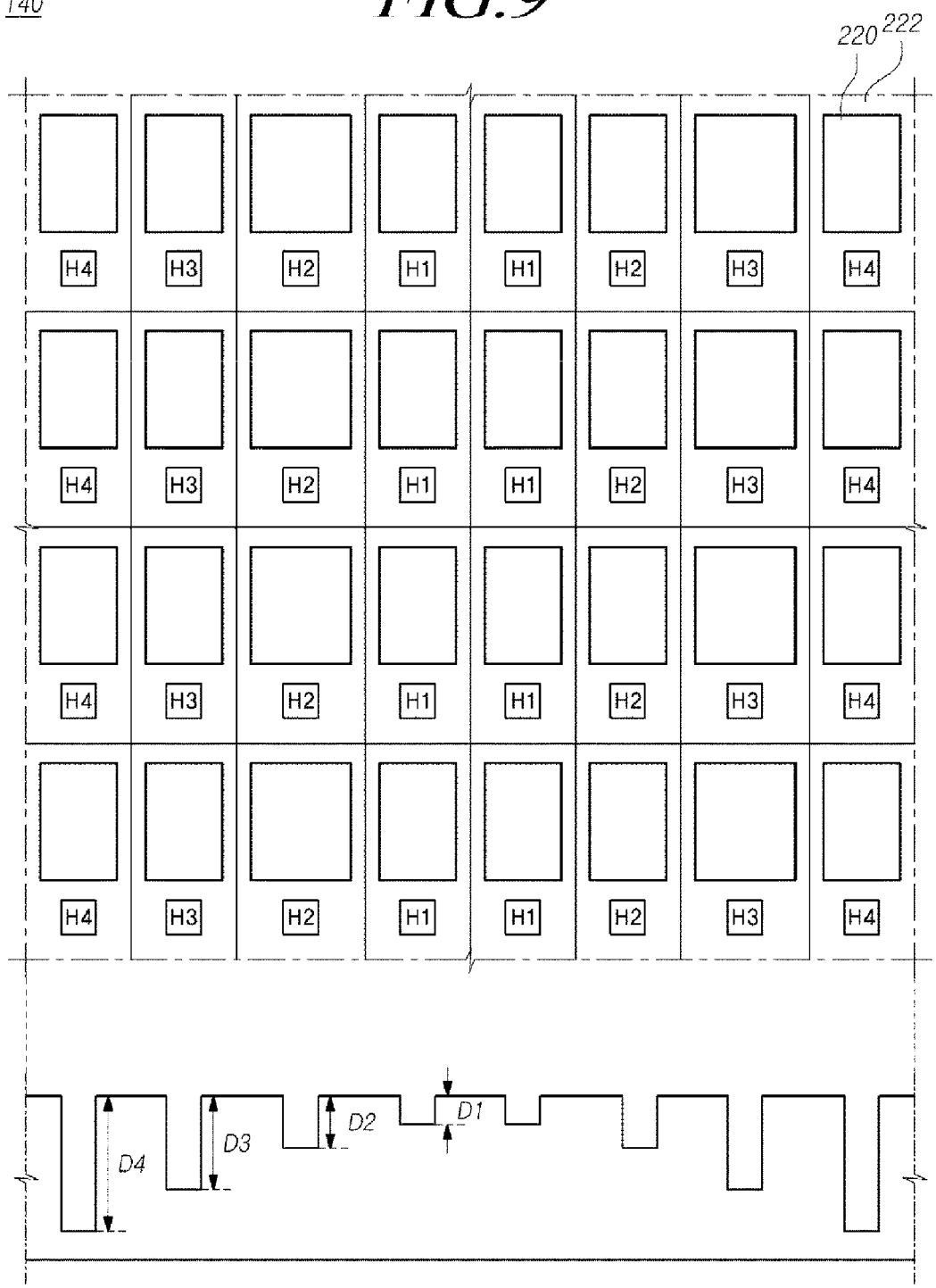
FIG. 9 is a schematic plan view of an organic light emitting display panel according to a ninth embodiment and illustrates the depth of each groove or hole.
Figure 10:
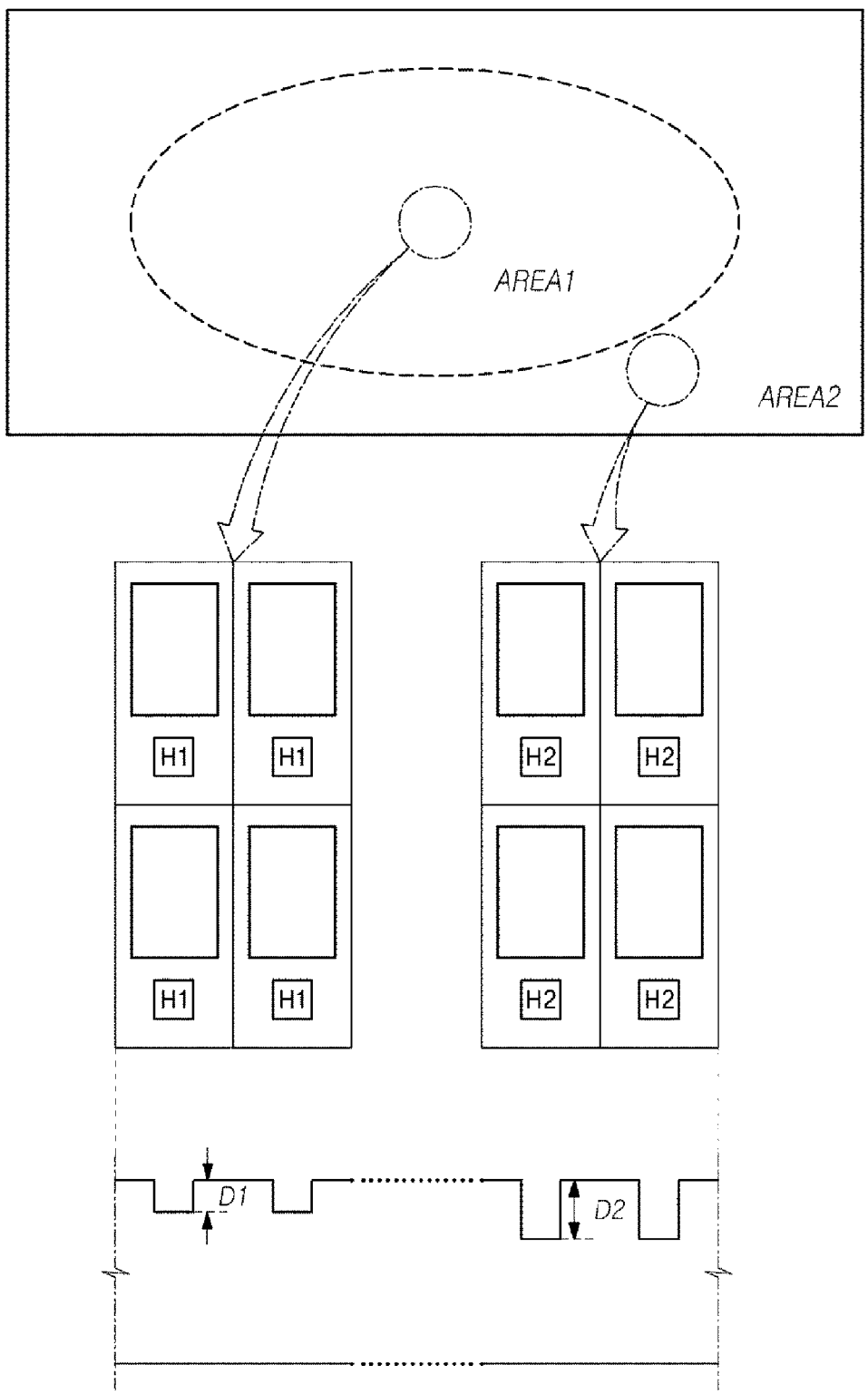
FIG. 10 is a schematic plan view of an organic light emitting display panel according to a tenth embodiment and illustrates the depth of each groove or hole.
Figure 11:
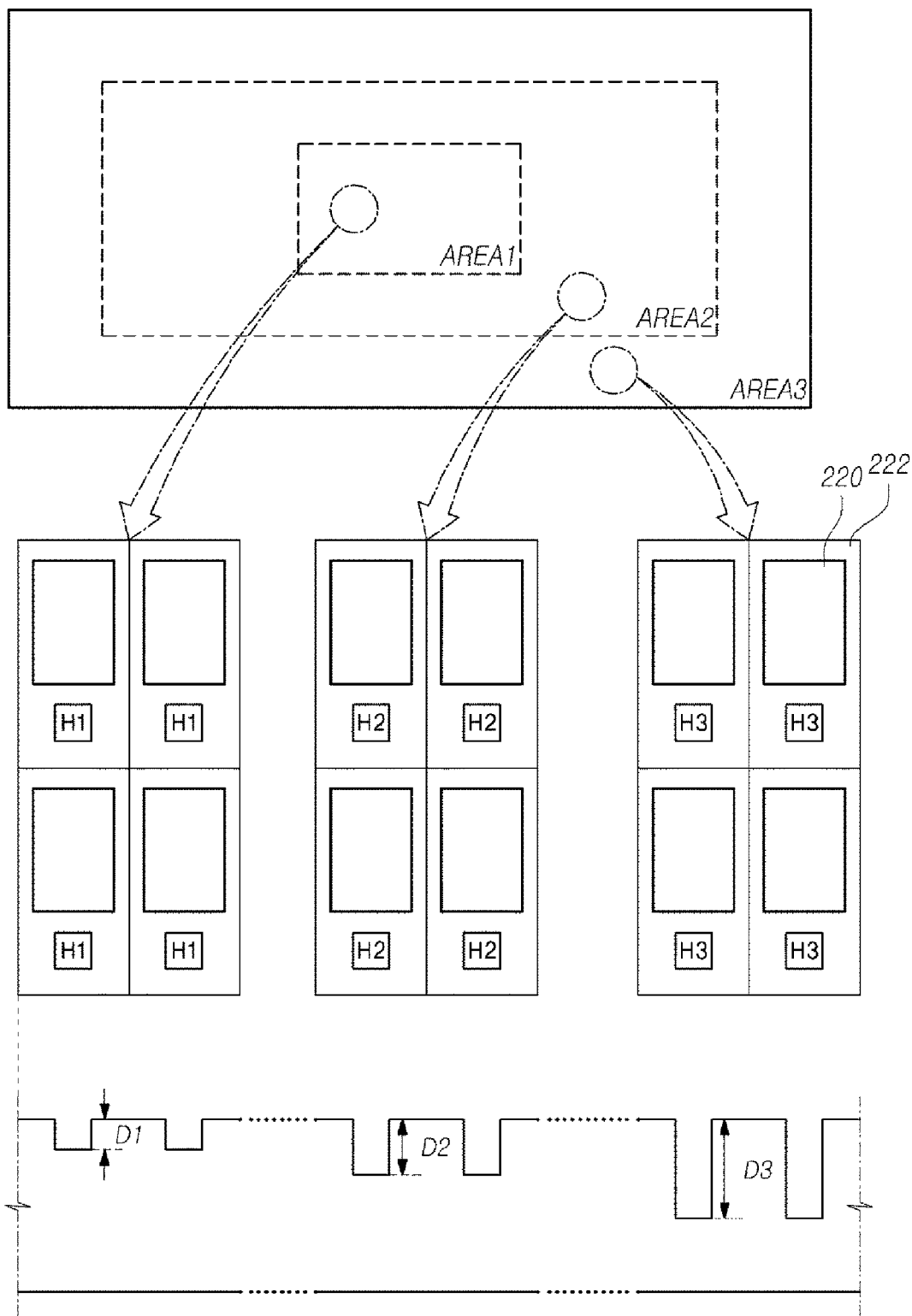
FIG. 11 is a schematic plan view of an organic light emitting display panel according to an eleventh embodiment and illustrates the depth of each groove or hole.

FIG. 9 is a schematic plan view of an organic light emitting display panel according to a ninth embodiment and illustrates the depth of each groove or hole. FIG. 10 is a schematic plan view of an organic light emitting display panel according to a tenth embodiment and illustrates the depth of each groove or hole. FIG. 11 is a schematic plan view of an organic light emitting display panel according to an eleventh embodiment and illustrates the depth of each groove or hole.

Referring to FIG. 9, the depths of the grooves or holes of the organic light emitting display panel according to the ninth embodiment may be the same or different. Specifically, the farther the grooves or holes H1, H2, H3 and H4 are from the center area of the organic light emitting display panel 140 and the closer the grooves or holes H1, H2, H3 and H4 are to the edge area of the organic light emitting display panel 140, the deeper the depths of the grooves or holes H1, H2, H3 and H4 may be. In addition, the depths of the grooves or holes H1, H2, H3 and H4 positioned in the edge area of the organic light emitting display panel 140 may be deeper than those of the grooves or holes H1, H2, H3 and H4 positioned in the center area of the organic light emitting display panel 140.

As shown in FIG. 9, the sizes (i.e., cross-section area in FIG. 11) of the grooves or holes included in the bank 222 in each pixel area P of the organic light emitting display panel 140 according to the ninth embodiment may be the same, and the depths D1, D2, D3 and D4 of each groove or hole H1, H2, H3 and H4 may become deeper in a first direction (i.e., horizontal direction in FIG. 11) (D1<D2<D3<D4).

Thus, the amount of the material 226' the same as that of the organic layer 226, which is positioned on the groove or hole H4 positioned in the edge area of the organic light emitting display panel 140, may be large. In addition, the amount of the material 226' the same as that of the organic layer 226, which is positioned on the groove or hole H1 positioned in the center area of the organic light emitting display panel 140, may be small.

Meanwhile, in the organic light emitting display panel 140 according to the tenth embodiment, the size of the groove/hole H1 formed in the first area Area1 and the size of the groove/hole H2 formed in the second area Area2 may be the same. However, the depth of the groove/hole H2 positioned in the second area Area2 may be deeper than that of groove/hole H1 positioned in the first area Area1.

Therefore, the amount of the material 226' the same as that of the organic layer 226, which is formed on the groove/hole H2 formed in the second area Area2 which is the edge area, may be larger than that of the material 226' the same as that of the organic layer 226, which is formed on the groove/hole H1 formed in the first area Area1 which is the center area. Thus, when the drying process is performed in the first area Area1 and the second area Area2, the solvent vapor amount can be uniformly maintained.

Similar to the tenth embodiment, in the organic light emitting display panel 140 according to the eleventh embodiment shown in FIG. 11, the size (i.e., cross-section area in FIG. 11) of the groove/hole H1 positioned in the first area Area1, the size of the groove/hole H2 positioned in the second area Area2 and the size of the groove/hole H3 positioned in the third area Area3 may be the same. However, the depth of the groove/hole H2 positioned in the second area Area2 may be deeper than that of groove/hole H1 positioned in the first area Area1, and the depth of the groove/hole H3 positioned in the third area Area3 may be the deepest (D1<D2<D3).

Figure 12:
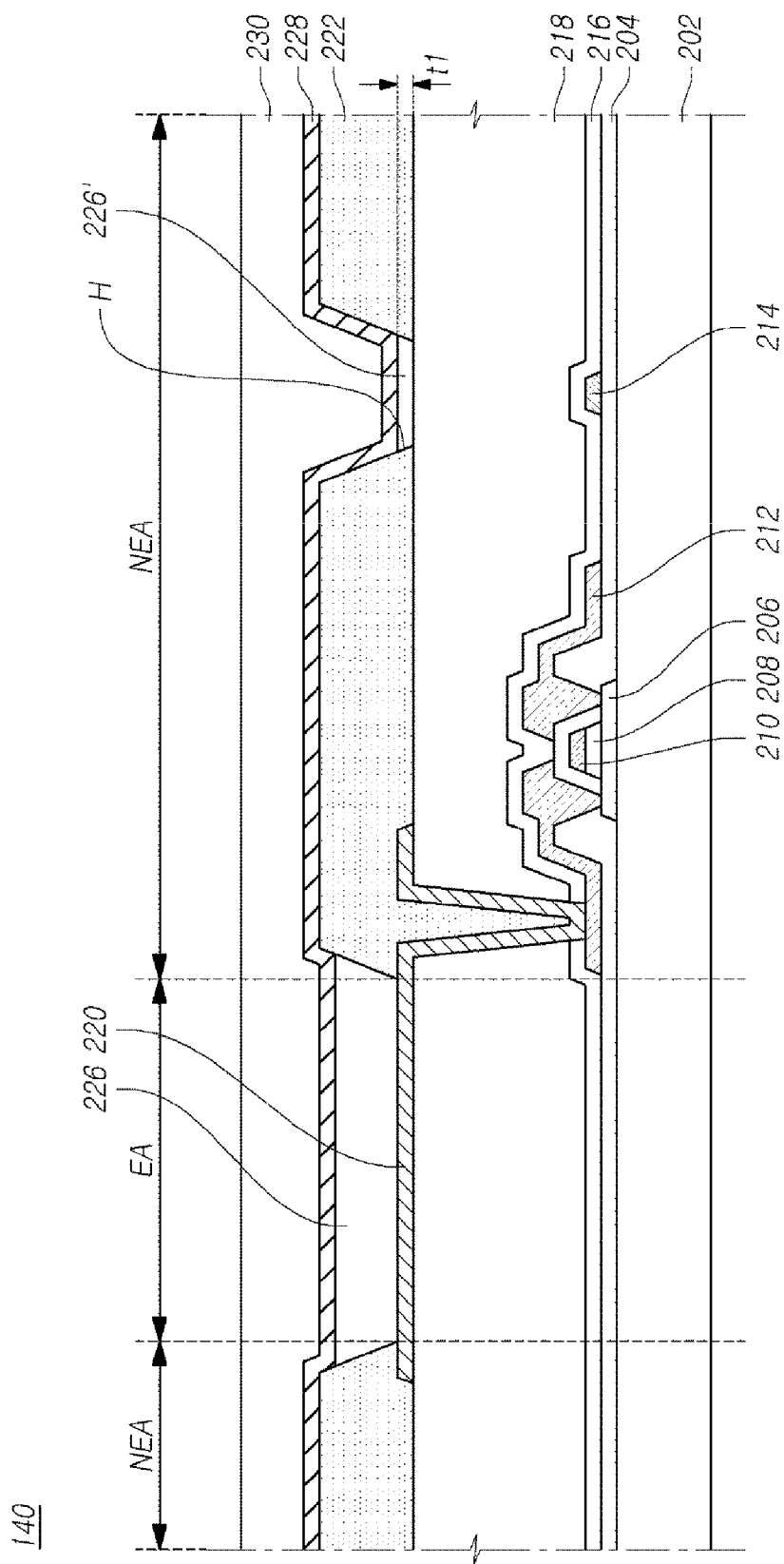
FIGS. 12 and 13 are schematic cross-sectional views of an organic light emitting display panel according to a twelfth embodiment.
Figure 13:
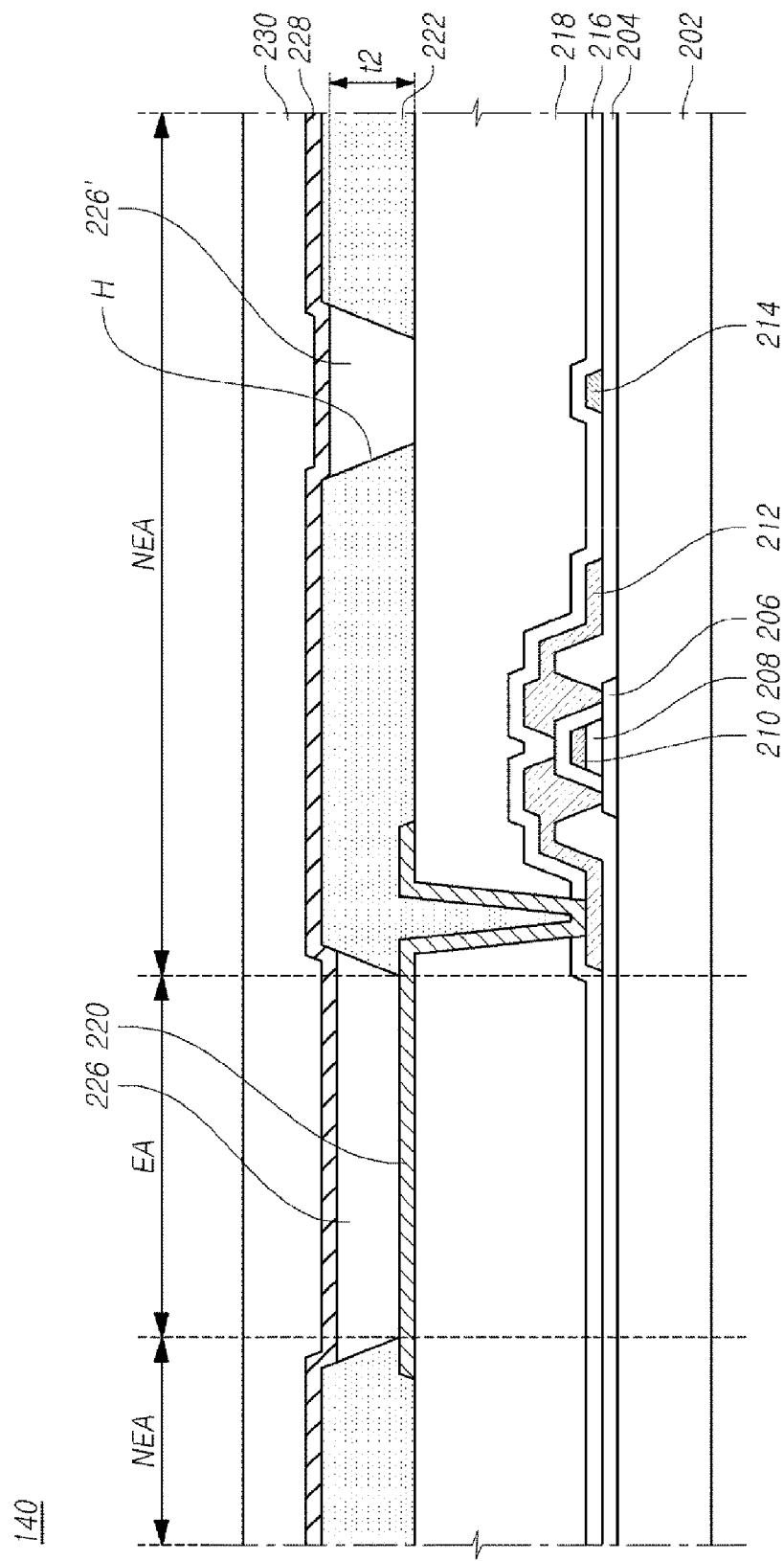

FIGS. 12 and 13 are schematic cross-sectional views of an organic light emitting display panel according to a twelfth embodiment.

FIG. 12 is a cross-sectional view illustrating a pixel area P including the groove/hole H positioned in the center area of the organic light emitting display panel 140. FIG. 13 is a cross-sectional view illustrating a pixel area P including the groove/hole H positioned in the edge area of the organic light emitting display panel 140.

Referring to FIG. 12, the material 226' the same as that of the organic layer 226 is formed in a first thickness t1, on the hole H formed in the bank 222. In contrast, referring to FIG. 13, the material 226' the same as that of the organic layer 226 is formed in a second thickness t2, on the hole H formed in the bank 222.

Therefore, the amount of the material 226' the same as that of the organic layer 226, which is formed on the groove/hole H positioned in the edge area, is larger than that of the amount of the material 226' the same as that of the organic layer 226, which is formed on the groove/hole H positioned in the center area. Thus, a drying condition can be uniform through a whole surface of the organic light emitting display panel 140.

In FIGS. 12 and 13, the cross-sectional view for the twelfth embodiment is illustrated, but the present invention is not limited thereto, and may include various embodiments as described with reference to previous drawings. For example, the amount of the material 226' the same as that of the organic layer 226 may be different in each specific area, and the amount of the material 226' the same as that of the organic layer 226 may be different in each pixel area P.

Figure 14:
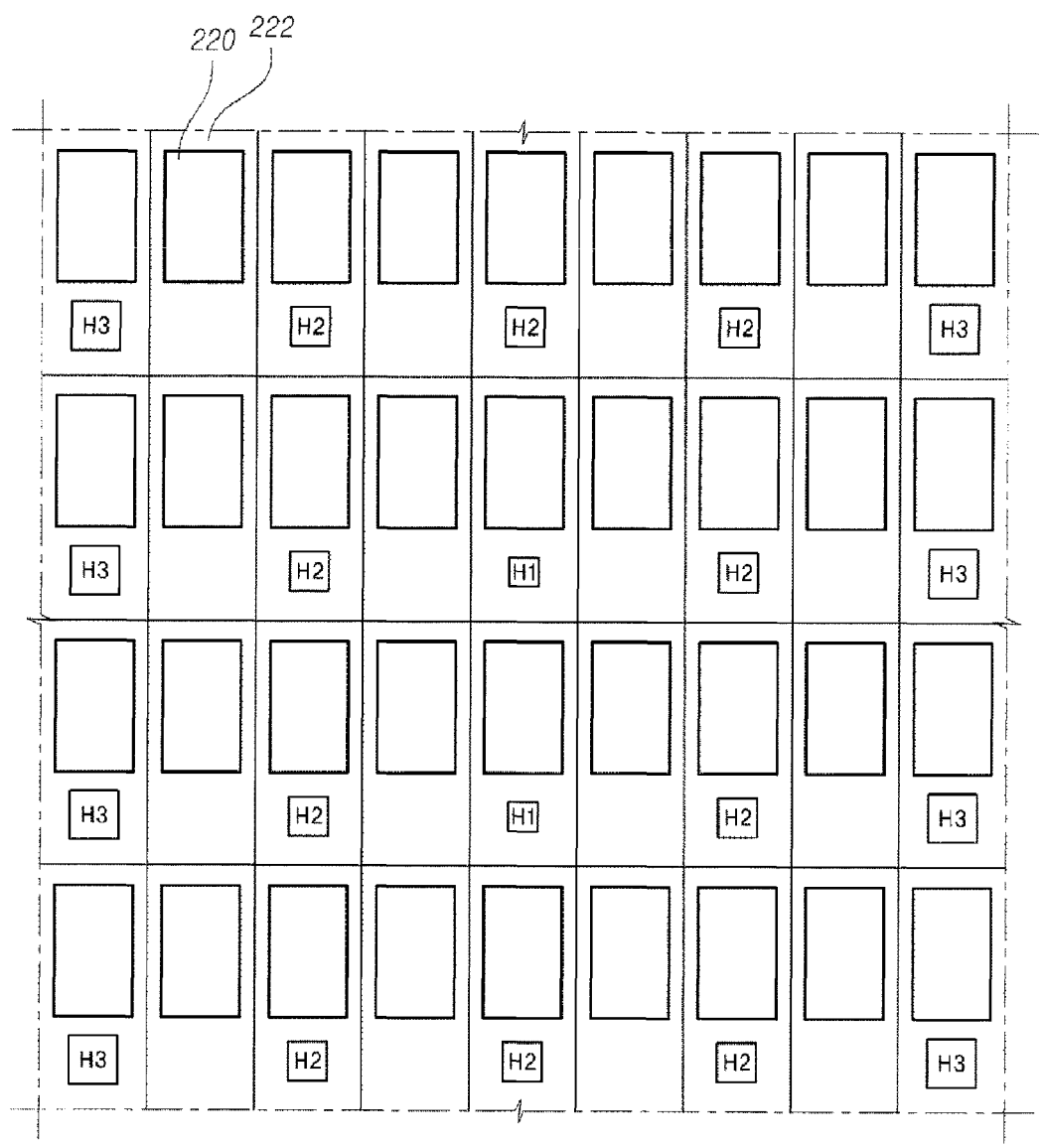
FIG. 14 is a schematic plan view of an organic light emitting display panel according to a thirteenth embodiment.
Figure 15:
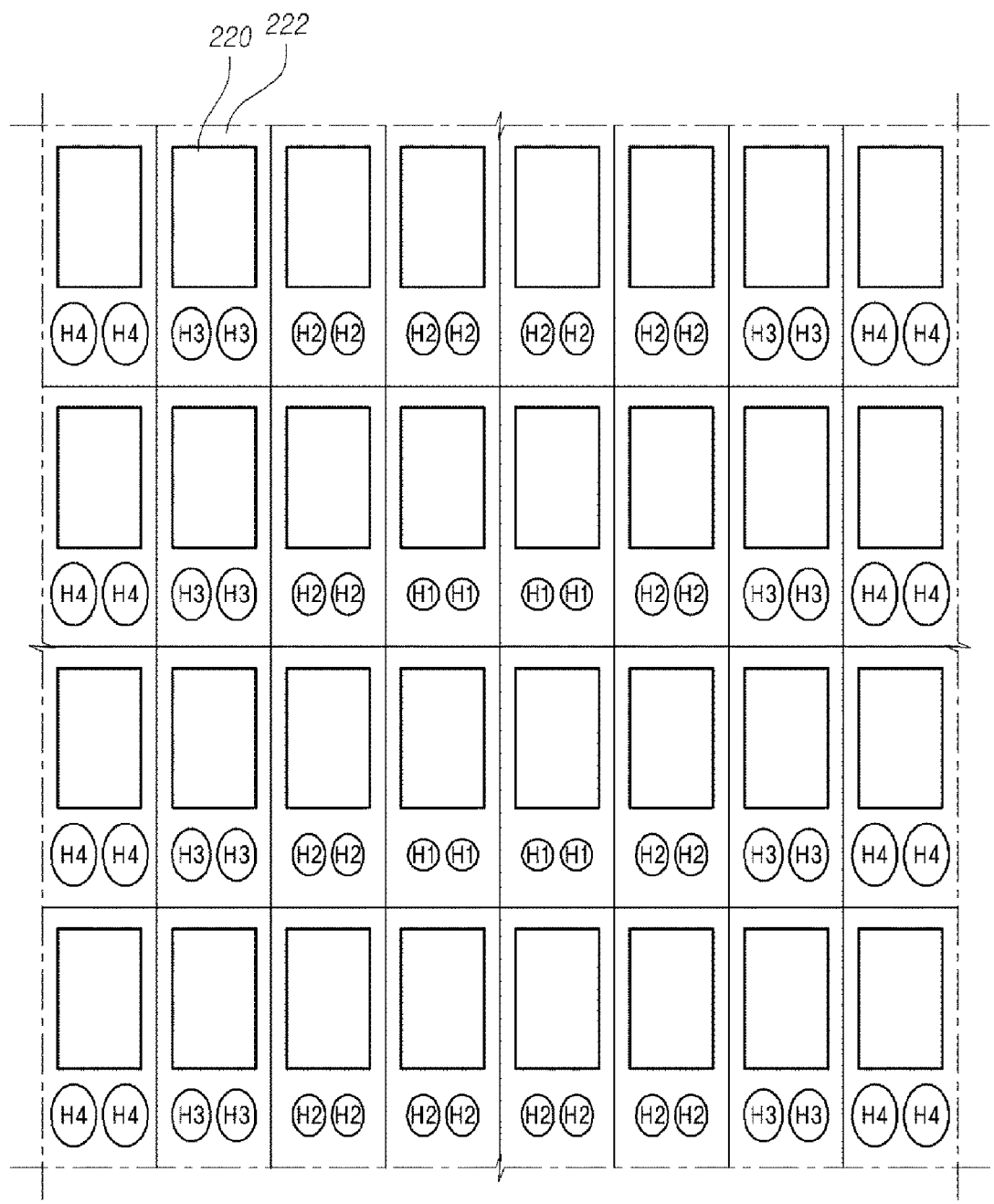
FIG. 15 is a schematic plan view of an organic light emitting display panel according to a fourteenth embodiment.
Figure 16:
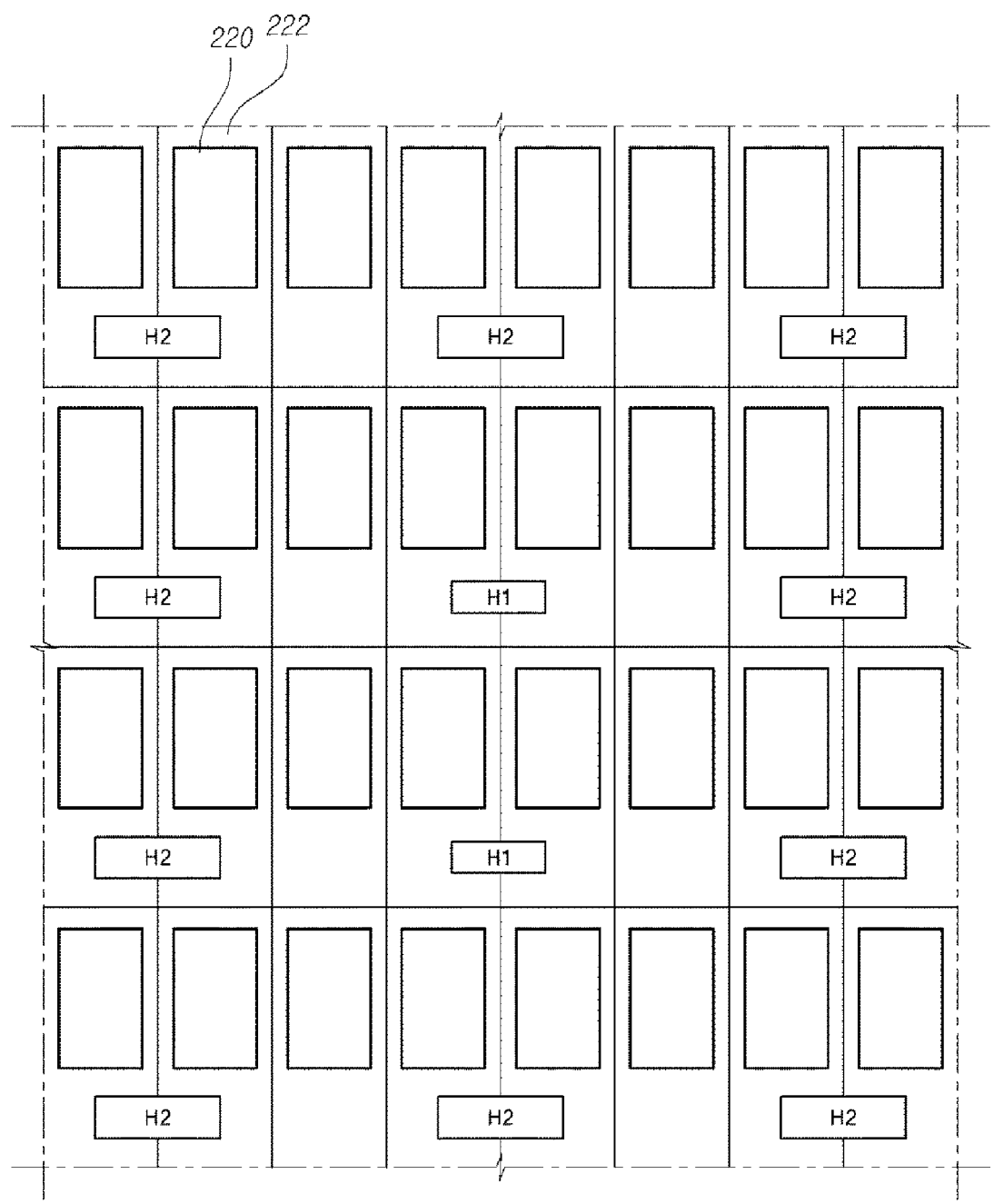
FIG. 16 is a schematic plan view of an organic light emitting display panel according to a fifteenth embodiment.
Figure 17:
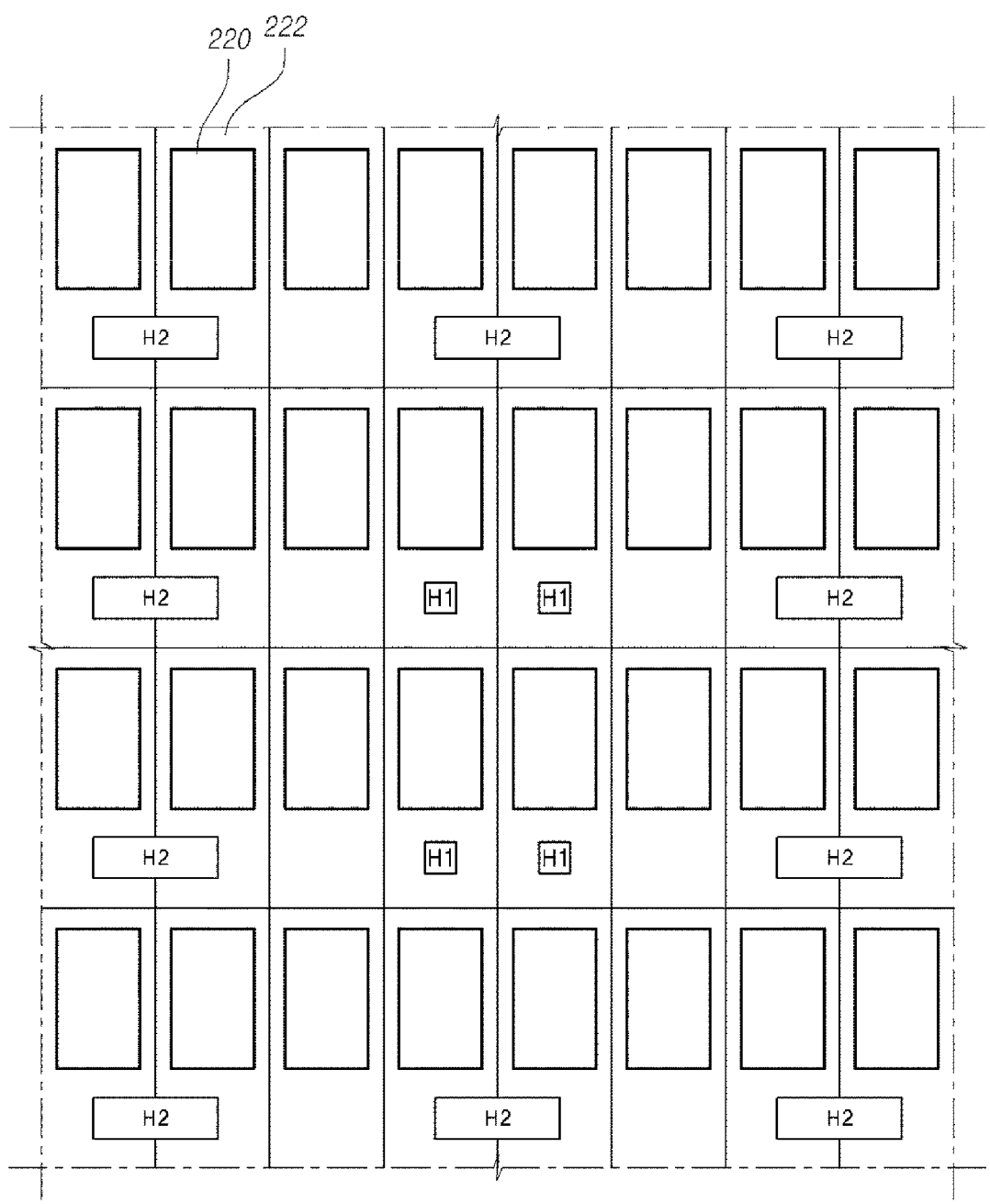
FIG. 17 is a schematic plan view of an organic light emitting display panel according to a sixteenth embodiment.

FIG. 14 is a schematic plan view of an organic light emitting display panel according to a thirteenth embodiment. FIG. 15 is a schematic plan view of an organic light emitting display panel according to a fourteenth embodiment. FIG. 16 is a schematic plan view of an organic light emitting display panel according to a fifteenth embodiment. FIG. 17 is a schematic plan view of an organic light emitting display panel according to a sixteenth embodiment.

Referring to FIGS. 14 to 17, in the organic light emitting display panel 140 according to embodiments, at least one groove or hole H may be positioned in each pixel area P. In contrast, the groove or hole H may be positioned in at least one among the plurality of pixel areas P, and may be positioned through two adjacent pixel areas P.

Specifically, in a case of the thirteenth embodiment, the grooves/holes H1, H2 and H3 may be positioned in every two pixel areas P one by one in a first direction (i.e., horizontal direction in FIG. 14). In a case of the fourteenth embodiment, two grooves/holes H1, H2, H3 and H4 may be formed in each pixel area P (refer FIG. 15). Meanwhile, the grooves/holes H1 and H2 may be formed through two pixel areas P like in the fifteenth embodiment, and the pixel area P in which the grooves/holes H1 and H2 are not formed may exist (refer to FIG. 16). In addition, in a case of the sixteenth embodiment, in the pixel area P of the center area, one groove/hole H1 may be positioned in each pixel area P1, and in the pixel area P of the edge area, one groove/hole H2 may be positioned in every two pixel areas P (refer to FIG. 17).

However, the thirteenth to sixteenth embodiments are illustrated for convenience of description. The organic light emitting display panel 140 according to the present invention is not limited thereto, and may have various structures. In addition, the closer the groove/hole H is to the edge area, the larger the size of the groove/hole H may be, the deeper the depth of the groove/hole H may be, or the larger the amount of the material 226' the same as the organic layer 226 may be.

Therefore, when the organic layer of the organic light emitting display panel 140 is dried, a vapor amount of the solvent is uniformly formed through a whole surface, and thus luminance degradation or a stain occurrence can be prevented.

In the above, the structure of the organic light emitting display panel 140 according to the present invention is described in detail. Hereinafter, a method of manufacturing the organic light emitting display panel 140 will be described using an example.

FIGS. 18 to 22B are views illustrating a method of manufacturing an organic light emitting display panel according to a seventeenth embodiment.

Referring to FIGS. 18 to 22B, the method of manufacturing an organic light emitting display panel 140 may include forming a pixel electrode 220 in each pixel area P on a substrate 202, forming a bank 222 positioned in a non-emission area NEA on the substrate 202, having a portion overlapping an edge of the pixel electrode 220, exposing a portion of the pixel electrode 220, and including a plurality of grooves or holes H, printing an organic solution on the exposed portion in the pixel electrode 220 and on the groove or hole H, and drying the organic solution to form an organic layer 226.

In the above-mentioned forming of the organic layer 226 by drying the organic solution, an amount of vapor of the organic solution generated in each pixel area of the organic light emitting display panel may be the same.

Here, steps of manufacturing a thin film transistor and various signal lines of the organic light emitting display panel 140 are omitted. In addition, descriptions related to structures and materials described with reference to above figures will be omitted.

Figure 18:
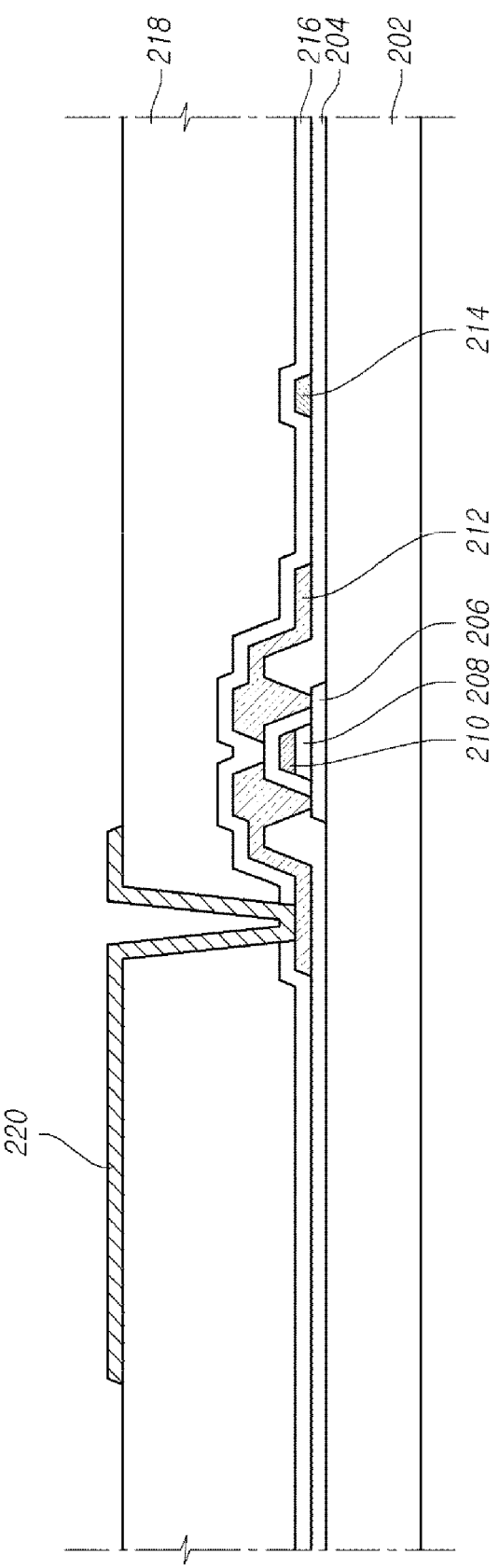
FIGS. 18 to 22B are views illustrating a method of manufacturing an organic light emitting display panel according to a seventeenth embodiment.

In the organic light emitting display panel 140 according to the seventeenth embodiment, the forming of the pixel electrode 220 on the substrate 202 is performed (refer to FIG. 18). The pixel electrode 220 which is an anode electrode may be formed in a deposition process, and for example, may be formed in a sputtering process.

The sizes of the pixel electrodes 220 in each pixel area P may be the same or may be different according to colors. A portion shown as the pixel electrode 220 in the FIG. 18 corresponds to an emission area EA, and a portion except for the emission area EA corresponds to a non-emission area NEA. In addition, the pixel area P may be defined by a gate line Gn and a data line Dn.

Figure 19:
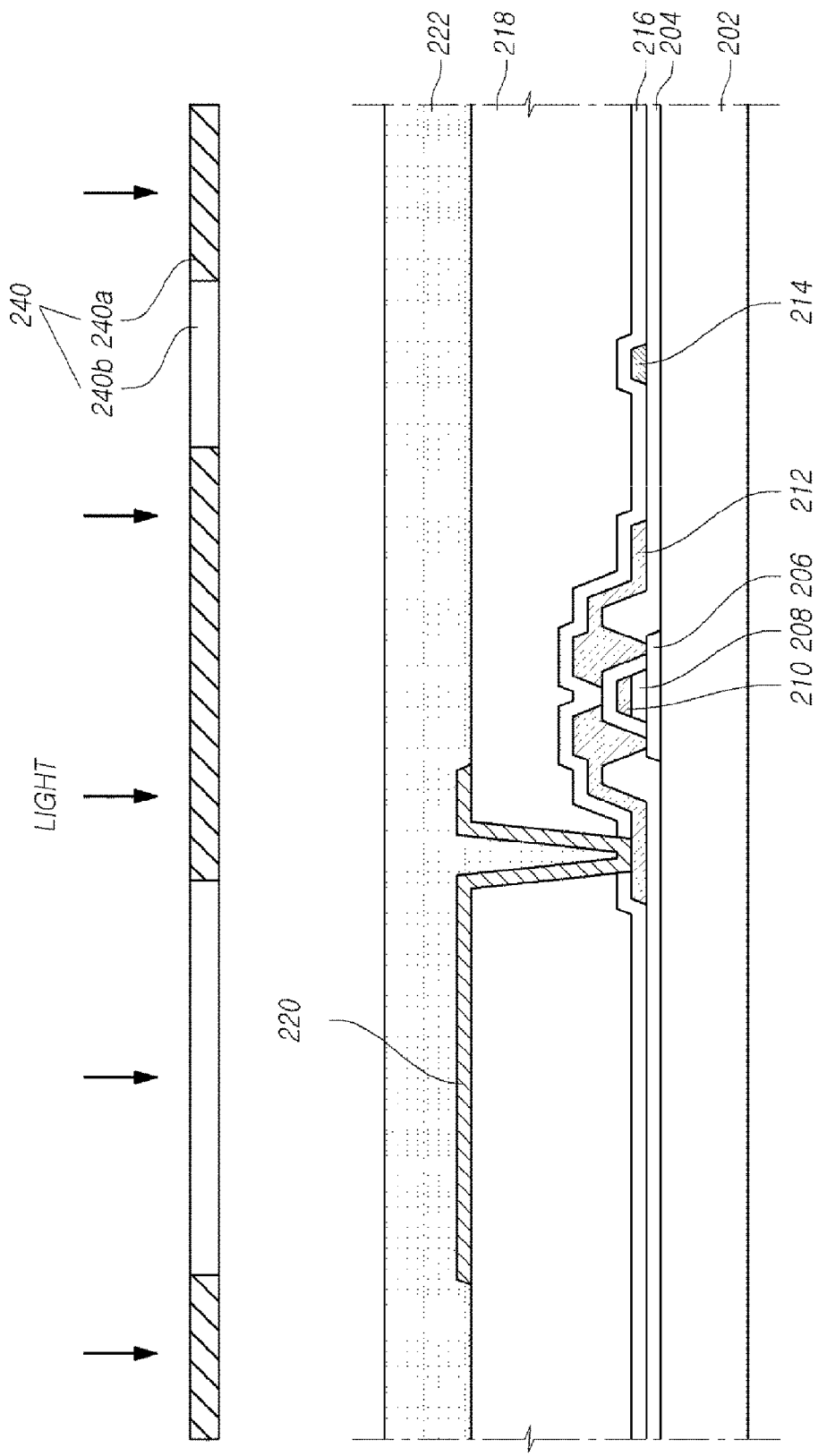
Figure 20:
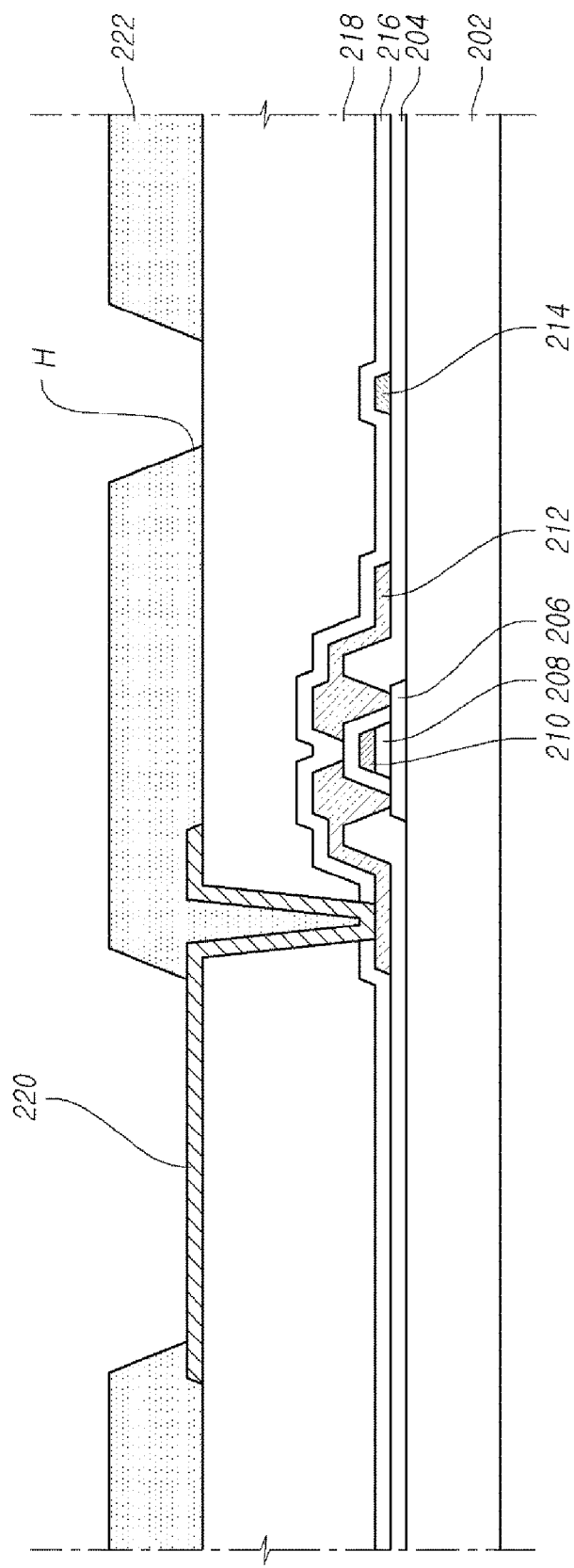

Next, the bank 222 also includes the groove or hole H is formed (refer to FIGS. 19 and 20). The groove or hole H is formed in the bank 222 which is formed in the non-emission area NEA of each pixel area P, and the size (i.e., cross-section area or thickness in FIGS. 19 and 20) of the groove or hole H may vary.

First of all, a bank forming material 222 corresponding to photosensitivity material is spread (e.g., by a deposition process) so that the bank forming material 222 covers the pixel electrode 222. Then the bank forming material 222 is exposed using a mask 240 including a light transmissive portion 240b and light blocking portion 240a. In addition, after the exposure, the bank forming material 222 is developed using a developing solution, and the bank and the groove or hole H may be formed.

Here, the bank forming material 222 may include an organic material, for example, photo acryl, which may be removed by the exposure and the development, and may have a hydrophobic property so that organic solutions 226a and 226' do not spread to the non-emission area NEA in a solution process.

The groove or hole H may be simultaneously formed using one mask 240 in the forming of the bank 222. Thus, a process of the forming of the groove or hole H does not need a separate and additional process.

Through such processes, the portion of the pixel electrode 220 may be exposed, the emission area EA may be formed, and the groove or hole H on which the material 226' the same as that of the organic layer 226 is laminated may be formed, simultaneously.

In forming the bank 222, the sizes of the grooves or holes H may be the same or different. The farther the groove or hole H is from a center area of the organic light emitting display panel 140 and the closer the groove or hole H is to an edge area of the organic light emitting display panel 140, the larger the size of the groove or hole H may be. In addition, the farther the groove or hole H is from the center area of the organic light emitting display panel 140 and the closer the groove or hole H is to the edge area of the organic light emitting display panel 140, the deeper the depth of the groove or hole H may be. These are described in detail in a part related to a structure.

Figure 21A:
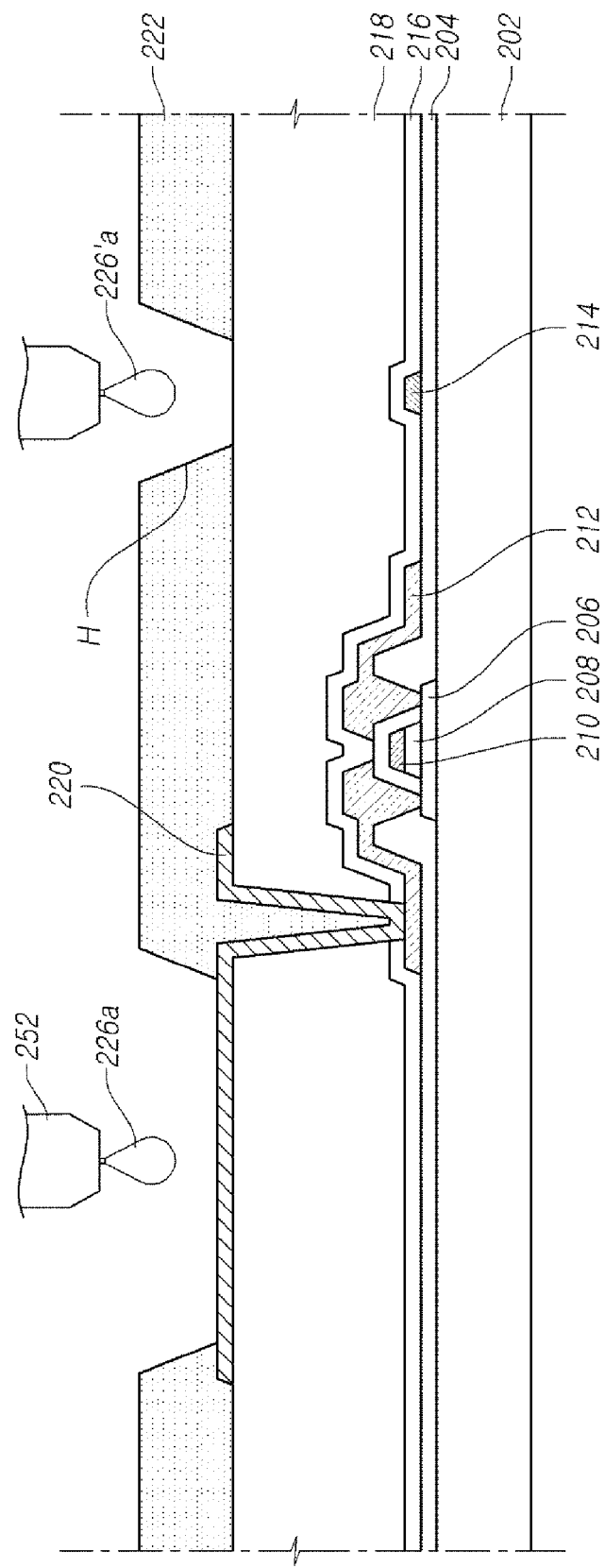
Figure 21B:
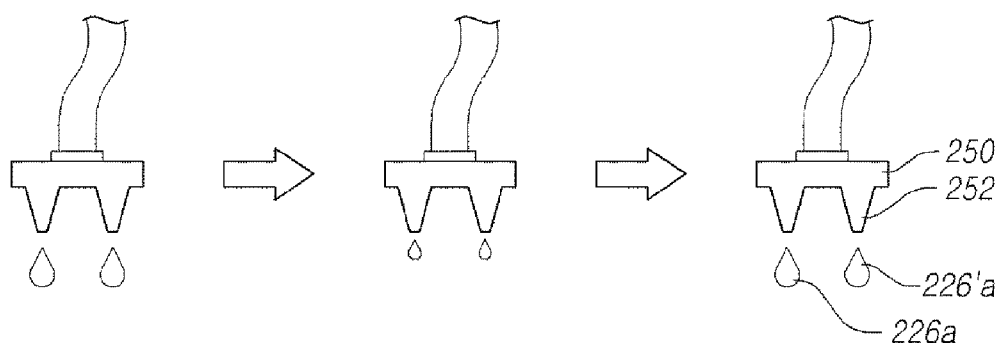

Next, the printing of the organic solutions 226a and 226'a on the portion of the pixel electrode 220 exposed by the bank 222 and the groove and hole H is performed. In FIGS. 21A and 21B, for convenience of description, an inkjet printing is illustrated as an example.

In such a step, the organic solutions may be simultaneously printed on the exposed portion of the pixel electrode 222 and the groove or hole H, and in this case, a process time can be reduced.

However, in the method of manufacturing the organic light emitting display panel 140 according to the present invention, the organic solutions may be printed at different time points, respectively.

Meanwhile, in the printing of the organic solutions 226a and 226'a, an amount of the organic solution 226'a printed on the groove or hole H positioned in the edge area of the organic light emitting display panel 140 may be larger than that of the organic solution printed on the groove or hole H positioned in the center area of the organic light emitting display panel 140.

In addition, in the printing of the organic solutions 226a and 226'a, the farther the groove or hole H is from the center area of the organic light emitting display panel 140 and the closer the groove or hole H is to the edge area of the organic light emitting display panel 140, the larger the amount of the organic solution 226'a printed on the groove or hole H may be. Therefore, thicknesses t1 and t2 of the materials the same as the organic layer 226 may be different.

Next, the drying of the organic solutions 226a and 226'a to form the organic layer 226 on the pixel electrode 220 and the forming the material the same as the organic layer 226 on the groove or hole H are performed.

The organic layer 226 may be formed of a solution including a high molecular series of organic material. The organic layer 226 is formed by spreading a liquid solution which is diffused or dissolved from a material of the organic layer 226 by a solvent, and heating and drying the spread liquid solution. When the organic layer 226 is formed as multiple layers, that is, when the organic layer 226 includes an a Hole Injection Layer (HIL), a Hole Transfer Layer (HTL), an Emitting Layer (EL), an Electron Transfer Layer (ETL), an Electron Injection Layer (EIL), and the like, processes of spreading and drying the organic materials corresponding to each layer may be sequentially performed.

The thicknesses of the materials the same as that of the organic layer 226 formed on the groove or hole H according to the embodiment may become different. That is, the thicknesses t1 and t2 of the material 226' formed on the groove or hole H in the edge area of the organic light emitting display panel 140 may be thicker than the thickness of the material 226' formed on the groove or hole H in the center area of the organic light emitting display panel 140. In addition, the farther the groove or hole H is from the center area of the organic light emitting display panel 140 and the closer the groove or hole H is to the edge area of the organic light emitting display panel 140, the thicker the thicknesses t1 and t2 of the material 226'a formed on the groove or hole H may be.

The amount of the printed organic solution 226'a may be controlled by controlling an amount of an ink 226" formed of an organic solution spurted from a nozzle of a printing apparatus 250. This does not need a separate process, and may be implemented through a control for the inkjet printing apparatus 250. That is, as shown in FIGS. 21A and 21B, a small amount of organic solution 226'a may be printed on the groove or hole H in the center area and a relatively large amount of organic solution 226'a may be printed on the groove or hole H in the edge area.

Therefore, an amount of a vapor of a solution generated in a process of drying an organic solution may be the same, through a whole surface of the organic light emitting display panel 140. Thus, problems such as a luminance degradation and a stain can be prevented, thereby securing a uniform image quality.

Figure 22A:
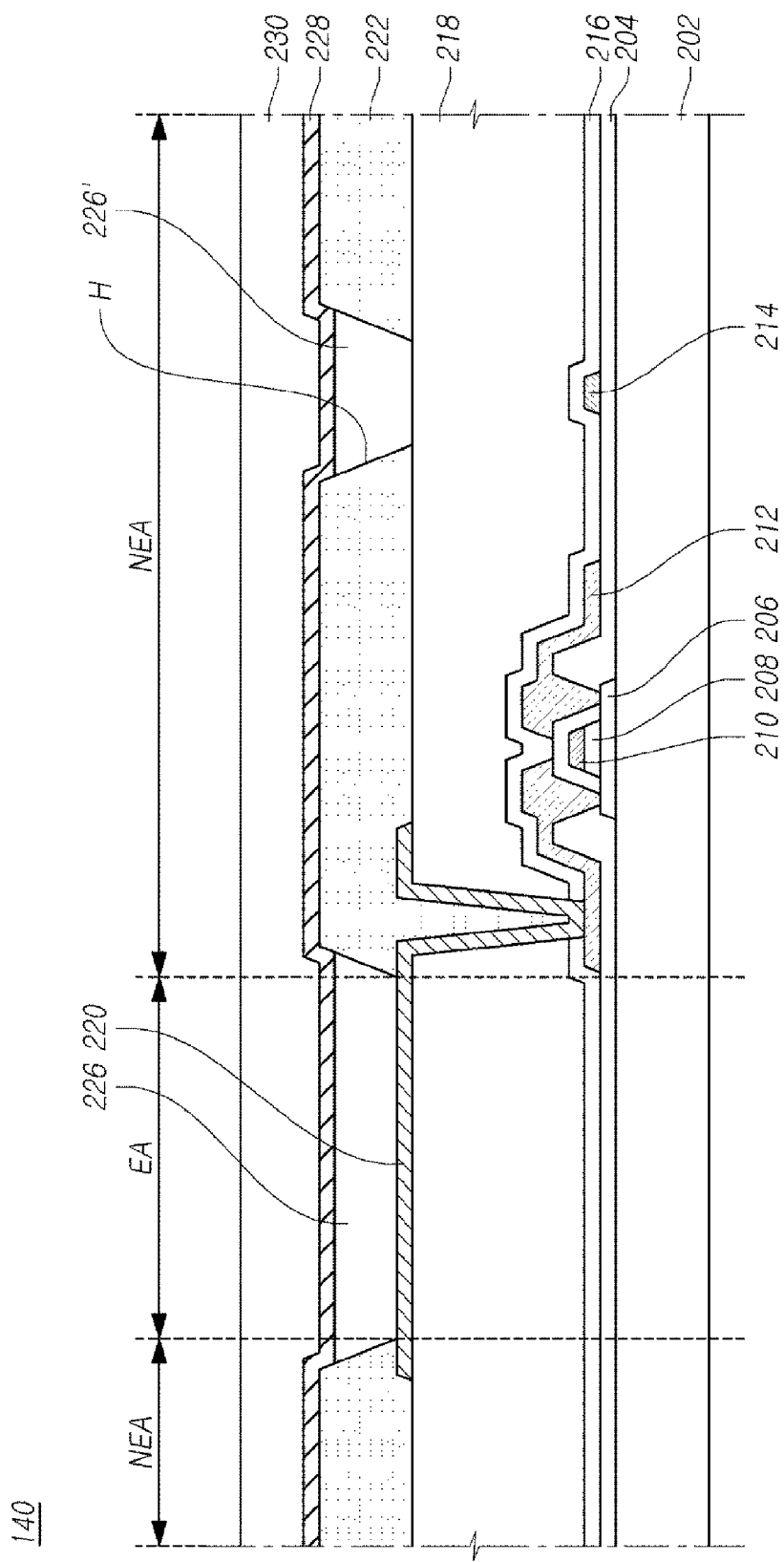
Figure 22B:
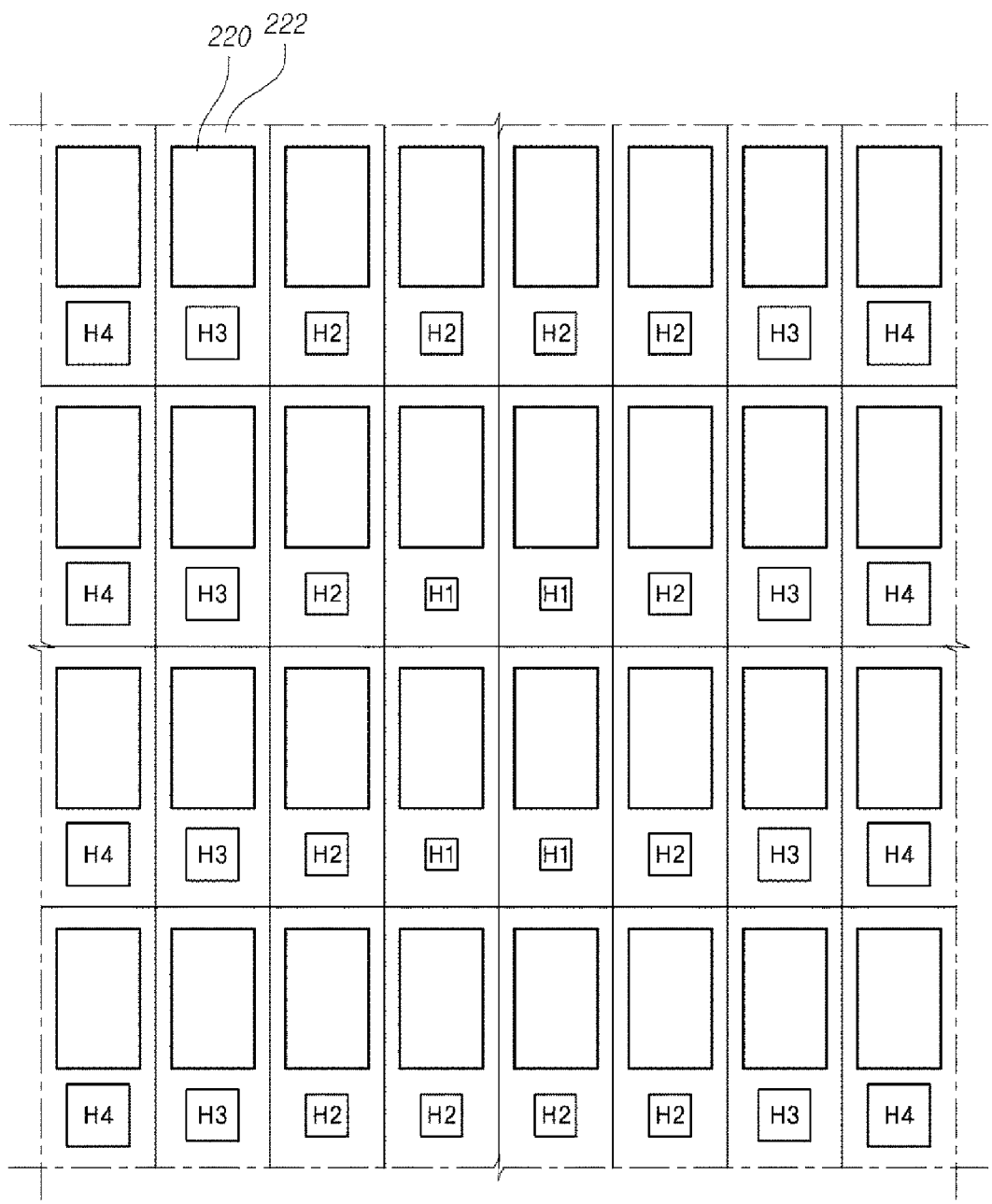

Finally, a common electrode 228 is deposited and a protection layer 230 is formed. As shown in FIGS. 22A and 22B, the organic light emitting display panel 140 is completed. FIG. 22A illustrates the first embodiment, and FIG. 22B illustrates the second embodiment.

An organic light emitting display device 100 according to the present invention may include a pixel electrode 220 positioned in an emission area EA on a substrate 202, and a bank 222 positioned in a non-emission area NEA on the substrate 202, having an edge overlapping the pixel electrode 220 and including a plurality of grooves or holes H.

The sizes (e.g., cross-section area) of the plurality of grooves or holes H may be the same or different. Specifically, the farther the groove or hole H is from the center area of the organic light emitting display panel 140 and the closer the groove or hole H is to the edge area of the organic light emitting display panel 140, the larger the size of the groove or hole H may be.

In addition, the depths of the plurality of grooves or holes H may be the same or different. Specifically, the farther the groove or hole H is from the center area of the organic light emitting display panel 140 and the closer the groove or hole H is to the edge area of the organic light emitting display panel 140, the deeper the depth of the groove or hole H may be.

A material 226' the same as that of the organic layer 226 which is positioned on the pixel electrode 220 may be positioned on the groove or hole H, and the amounts of the material 226' may be different.

Specifically, the farther the groove or hole H is from the center area of the organic light emitting display panel 140 in the organic light emitting display device 100 and the closer the groove or hole H is to the edge area of the organic light emitting display panel 140 in the organic light emitting display device 100, the larger the amount of the material 226' the same as that of the organic layer 226, which is positioned on the groove or hole H may be.

To summarize, the organic light emitting display device 100 and the organic light emitting display panel 140 according to the present invention control the size of the groove or hole H formed in the non-emission area NEA in each pixel area P and control the amount of the material 226' the same as that of the organic layer 226, which is formed on the groove or hole H. Therefore, an amount of a solvent vapor generated in a drying process can be uniform, and thus a visibility characteristic degradation such as a luminance degradation and a stain occurrence can be prevented.

Although various embodiments have been described up to now with reference to the accompanying drawings, the present invention is not limited to them.

Further, the terms "includes", "constitutes", or "has" mentioned above mean that a corresponding structural element is included unless they have no reverse meaning. Accordingly, it should be interpreted that the terms may not exclude but further include other structural elements. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although the embodiments of the present invention have been described for illustrative purposes, those skilled in the art will appreciate that various modifications, additions and substitutions are possible, without departing from the scope and spirit of the invention. Accordingly, the embodiments disclosed in the present invention are merely to not limit but describe the technical spirit of the present invention. Further, the scope of the technical spirit of the present invention is limited by the embodiments. The scope of the present invention shall be construed on the basis of the accompanying claims in such a manner that all of the technical ideas included within the scope equivalent to the claims belong to the present invention.

What is claimed is:

1. An organic light emitting display panel comprising:
   a substrate having a plurality of pixel areas, each pixel area in an area defined by data lines and gate lines and including an emitting pixel portion and a non-emitting pixel portion;
   a pixel electrode in each of the plurality of pixel areas on the substrate;
   a bank in the non-emitting pixel portion of each pixel area on the substrate, the bank overlapping an edge of each pixel electrode and a thin film transistor electrically connected to each pixel electrode, and exposing a portion of each pixel electrode in the emitting pixel portion; and
   an organic layer on each exposed pixel electrode,
   wherein one or a plurality of grooves or holes are surrounded by the bank in the non-emitting pixel portion of each pixel area, and a material the same as that of the organic layer is positioned in the one or the plurality of grooves or holes surrounded by the bank,
   wherein sizes or depths of the one or plurality of grooves or holes formed in at least one of the plurality of pixel areas are different from sizes or depths of grooves or holes formed in other pixel areas.

2. The organic light emitting display panel of claim 1, wherein the size of the one or plurality of grooves or holes formed in at least one of the plurality of pixel areas and positioned in an edge area of the organic light emitting display panel is larger than the size of the one or plurality of grooves or holes formed in at least one of the plurality of pixel areas and positioned in a center area of the organic light emitting display panel.

3. The organic light emitting display panel of claim 1, wherein the farther the one or plurality of grooves or holes formed in at least one of the plurality of pixel areas are from a center of the organic light emitting display panel and the closer the one or plurality of grooves or holes formed in at least one of the plurality of pixel areas are to the edge of the organic light emitting display panel, the deeper the depth of the one or plurality of grooves or holes.

4. The organic light emitting display panel of claim 1, wherein amounts of the material the same as that of the organic layer positioned on the one or plurality of grooves or holes formed in at least one of the plurality of pixel areas are different from those of the grooves or holes formed in other pixel areas.

5. The organic light emitting display panel of claim 1, wherein an amount of the material the same as that of the organic layer positioned on the grooves or holes formed in other pixel areas, which are positioned in an edge area of the organic light emitting display panel, is larger than an amount of the material the same as that of the organic layer positioned in the one or plurality of grooves or holes formed in at least one of the plurality of pixel areas, which are positioned in a center area of the organic light emitting display panel.

6. The organic light emitting display device of claim 1, wherein the organic layer and the material are surrounded by the bank, respectively.

7. The organic light emitting display device of claim 1, wherein the organic layer comprises an emitting layer.

8. An organic light emitting display device comprising:
a pixel electrode positioned in an emission area on a substrate; and
a bank positioned in a non-emission area on the substrate, having an edge overlapping the pixel electrode, and including a plurality of grooves or holes therein,
wherein a material the same as that of an organic layer positioned on the pixel electrode is positioned in the plurality of grooves or holes, and
wherein the farther the groove or hole is from a center of the organic light emitting display and the closer the groove or hole is to the edge of the organic light emitting display panel, the deeper the depth of the plurality of grooves or holes.

9. The organic light emitting display device of claim 8, wherein sizes of the grooves or holes are the same or different.

10. The organic light emitting display device of claim 8, wherein the farther the groove or hole is from a center of an organic light emitting display panel of the organic light emitting display device and the closer the groove or hole is to an edge of the organic light emitting display panel, the larger an amount of the material the same as that of the organic layer positioned on the groove or hole.

* * * * *